United States Patent
Lee

(10) Patent No.: US 9,628,091 B1
(45) Date of Patent: Apr. 18, 2017

(54) PHASE DETECTOR FOR CLOCK DATA RECOVERY CIRCUIT

(71) Applicant: VIA Alliance Semiconductor Co., Ltd., Shanghai (CN)

(72) Inventor: Yeong-Sheng Lee, Fremont, CA (US)

(73) Assignee: VIA ALLIANCE SEMICONDUCTOR CO., LTD., Shanghai (CN)

( * ) Notice: Subject to any disclaimer, the term of this patent is extended or adjusted under 35 U.S.C. 154(b) by 0 days.

(21) Appl. No.: 15/243,287

(22) Filed: Aug. 22, 2016

Related U.S. Application Data

(63) Continuation-in-part of application No. 15/203,392, filed on Jul. 6, 2016.

(51) Int. Cl.
*H04B 3/46* (2015.01)
*H03L 7/08* (2006.01)
*H03L 7/087* (2006.01)

(52) U.S. Cl.
CPC ............ *H03L 7/0807* (2013.01); *H03L 7/087* (2013.01)

(58) Field of Classification Search
CPC ....... H04L 7/0008; H04L 7/02; H04L 7/0331; H04L 7/0337; H04L 7/033; H04L 7/0334; H04L 7/0029; H04L 7/0338; H03L 7/091; H03L 7/0814; G06F 1/10
USPC .......................... 375/226, 227, 354, 355, 371
See application file for complete search history.

(56) References Cited

U.S. PATENT DOCUMENTS

| | | | | |
|---|---|---|---|---|
| 2012/0269243 A1* | 10/2012 | Lin | .......................... | H04L 7/033 375/224 |
| 2014/0340121 A1* | 11/2014 | Ozasa | ...................... | H03L 7/087 327/12 |

\* cited by examiner

*Primary Examiner* — Zewdu Kassa
(74) *Attorney, Agent, or Firm* — McClure, Qualey & Rodack, LLP

(57) ABSTRACT

A phase detector includes a clock delay circuit, a data delay circuit, a control circuit, a D flip-flop, and a logic circuit. The clock delay circuit delays a clock signal so as to generate a delay clock signal. The data delay circuit delays a data signal so as to generate a delay data signal. The control circuit adjusts the delay time of the clock delay circuit and the delay time of the data delay circuit according to the clock signal and the delay clock signal. The D flip-flop generates a register signal according to the data signal and the clock signal. The logic circuit generates an up control signal and a down control signal according to the data signal, the delay data signal, and the register signal so as to control a charge pump of a CDR (Clock Data Recovery) circuit.

18 Claims, 22 Drawing Sheets

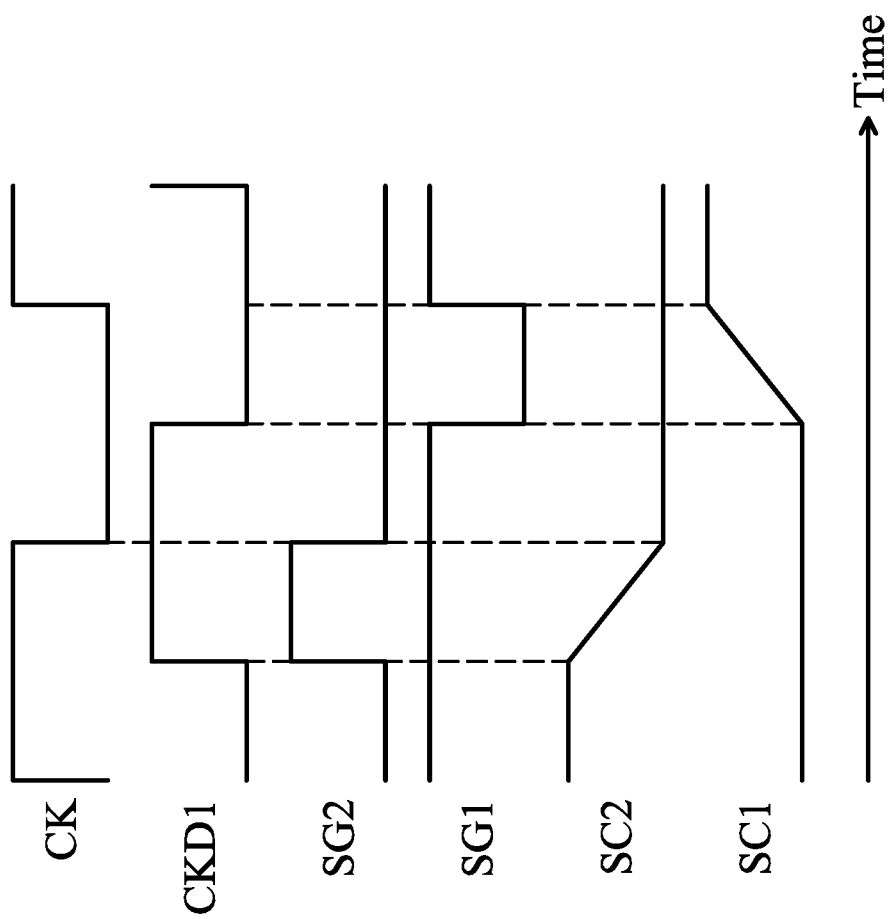

PHASE DETECTOR FOR CLOCK DATA RECOVERY CIRCUIT

CROSS REFERENCE TO RELATED APPLICATIONS

This application is a Continuation-In-Part of application Ser. No. 15/203,392, filed on Jul. 6, 2016, the entirety of which is incorporated by reference herein.

BACKGROUND OF THE INVENTION

Field of the Invention

The disclosure generally relates to a phase detector, and more specifically, to a phase detector for use in a CDR (Clock Data Recovery) circuit.

Description of the Related Art

The purpose of designing various protocols is to transfer a set of information (data) from one place to another. Serial data communication is often used to transmit the data at a high speed. At the receiver end, the transmitted data has to be retrieved without losing its integrity with the accompanied timing information. This process is clock and data recovery.

However, conventional CDR (Clock Data Recovery) circuits usually face the following problems. First, the charge pump of the CDR circuit has an unstable output voltage, such as a triangular-waveform output voltage, and this results in more jitters in the recovered clock. Second, the recovered clock is not accurate enough due to the non-ideal clock-to-output delay occurring in a main D flip-flop of the CDR circuit. Accordingly, there is a need to design a new solution for solving the aforementioned problems in the prior art.

BRIEF SUMMARY OF THE INVENTION

In a preferred embodiment, the disclosure is directed to a phase detector for use in a CDR (Clock Data Recovery) circuit. The CDR circuit generates a clock signal according to a data signal, including: a clock delay circuit, delaying the clock signal so as to generate a first delay clock signal, wherein a delay time of the clock delay circuit is adjustable according to a first control signal and a second control signal; a data delay circuit, delaying the data signal so as to generate a first delay data signal, wherein a delay time of the data delay circuit is adjustable according to the first control signal and the second control signal; a first control circuit, generating the first control signal and the second control signal according to the clock signal and the first delay clock signal; a main D flip-flop, generating a register signal according to the data signal and the clock signal; and a logic circuit, generating an up control signal and a down control signal according to the data signal, the first delay data signal, and the register signal so as to control a charge pump of the CDR circuit.

In some embodiments, the main D flip-flop has a data terminal for receiving the data signal, a clock terminal for receiving the clock signal, and an output terminal for outputting the register signal.

In some embodiments, each of the clock delay circuit and the data delay circuit includes an HBTD (Half Bit-Time Delay) circuit, wherein the HBTD circuit includes a plurality of delay units, wherein the plurality of delay units are cascaded between a HBTD input and a HBTD output to generate delay, wherein a delay time of each of the plurality of delay units is adjustable according to the first control signal and the second control signal, wherein for the HBTD circuit of the clock delay circuit, the HBTD input receives the clock signal and the HBTD output generates the first delay clock signal, and wherein for the HBTD circuit of the data delay circuit, the HBTD input receives the data signal and the HBTD output generates the first delay data signal.

In some embodiments, each of the plurality of delay units includes: a first P-type transistor, wherein the first P-type transistor has a control terminal, a first terminal coupled to a supply voltage, and a second terminal coupled to a first node; a second P-type transistor, wherein the second P-type transistor has a control terminal, a first terminal coupled to the first node, and a second terminal coupled to a second node; a first N-type transistor, wherein the first N-type transistor has a control terminal, a first terminal coupled to a third node, and a second terminal coupled to the second node; a second N-type transistor, wherein the second N-type transistor has a control terminal, a first terminal coupled to a ground voltage, and a second terminal coupled to the third node; and a first inverter, wherein the first inverter has an input terminal coupled to the second node, and an output terminal coupled to a delay unit output node, wherein the control terminal of one of the first P-type transistor and the second P-type transistor is coupled to a delay unit input node, and the control terminal of the other one of the first P-type transistor and the second P-type transistor is coupled to the first control signal, wherein the control terminal of one of the first N-type transistor and the second N-type transistor is coupled to the delay unit input node, and the control terminal of the other one of the first N-type transistor and the second N-type transistor is coupled to the second control signal.

In some embodiments, the first control circuit includes a first tuner which includes: a first OR gate, wherein the first OR gate has a first input terminal for receiving the clock signal, a second input terminal for receiving the first delay clock signal, and an output terminal for outputting a first gate control signal at a fourth node; a third P-type transistor, wherein the third P-type transistor has a control terminal coupled to a fifth node, a first terminal coupled to a supply voltage, and a second terminal coupled to the fifth node; a first current sink, drawing a first current from the fifth node; a fourth P-type transistor, wherein the fourth P-type transistor has a control terminal coupled to the fifth node, a first terminal coupled to the supply voltage, and a second terminal coupled to a sixth node; a fifth P-type transistor, wherein the fifth P-type transistor has a control terminal coupled to the fourth node, a first terminal coupled to the sixth node, and a second terminal coupled to a first control node; a first capacitor, coupled between the first control node and a ground voltage, wherein the first control node is arranged for outputting the first control signal; and a first switch, coupled between the first control node and the ground voltage, wherein the first switch is selectively closed or opened according to a switch control signal.

In some embodiments, the first control circuit includes a second tuner which includes: a first AND gate, wherein the first AND gate has a first input terminal for receiving the clock signal, a second input terminal for receiving the first delay clock signal, and an output terminal for outputting a second gate control signal at a seventh node; a third N-type transistor, wherein the third N-type transistor has a control terminal coupled to an eighth node, a first terminal coupled to the ground voltage, and a second terminal coupled to the eighth node; a first current source, supplying a second current to the eighth node; a fourth N-type transistor, wherein the fourth N-type transistor has a control terminal coupled to the eighth node, a first terminal coupled to the ground voltage, and a second terminal coupled to a ninth node; a fifth N-type transistor, wherein the fifth N-type transistor has a control terminal coupled to the seventh node, a first terminal coupled to the ninth node, and a second terminal coupled to a second control node; a second capacitor, coupled between the second control node and the ground voltage, wherein the second control node is arranged for outputting the second control signal; and a second switch, coupled between the supply voltage and the second control node, wherein the second switch is selectively closed or opened according to the switch control signal.

In some embodiments, the first control circuit further includes a power-saving circuit which includes: a sixth P-type transistor, wherein the sixth P-type transistor has a control terminal for receiving a second power-saving signal, a first terminal coupled to the supply voltage, and a second terminal coupled to the fifth node, wherein the second power-saving signal is outputted to be at low voltage level after a predetermined time to turn off both the third P-type transistor and the fourth P-type transistor.

In some embodiments, the first control circuit further includes a power-saving circuit which includes: a sixth N-type transistor, wherein the sixth N-type transistor has a control terminal for receiving a first power-saving signal, a first terminal coupled to the ground voltage, and a second terminal coupled to the eighth node, wherein the first power-saving signal is outputted to be at high voltage level after a predetermined time to turn off both the third N-type transistor and the fourth N-type transistor.

In some embodiments, the logic circuit includes an up control combination circuit which includes: a second AND gate, wherein the second AND gate has a first input terminal for receiving the data signal, a second input terminal for receiving the first delay data signal, a third input terminal for receiving an inverted register signal, and an output terminal, wherein the inverted register signal has a complementary logic level to that of the register signal; a third AND gate, wherein the third AND gate has a first input terminal for receiving an inverted data signal, a second input terminal for receiving an inverted first delay data signal, a third input terminal for receiving the register signal, and an output terminal, wherein the inverted data signal has a complementary logic level to that of the data signal, and wherein the inverted first delay data signal has a complementary logic level to that of the first delay data signal; and a second OR gate, wherein the second OR gate has a first input terminal coupled to the output terminal of the second AND gate, a second input terminal coupled to the output terminal of the third AND gate, and an output terminal for outputting the up control signal.

In some embodiments, the logic circuit includes a down control combination circuit which includes: a fourth AND gate, wherein the fourth AND gate has a first input terminal for receiving the data signal, a second input terminal for receiving the inverted first delay data signal, a third input terminal for receiving the register signal, and an output terminal, wherein the inverted first delay data signal has a complementary logic level to that of the first delay data signal; a fifth AND gate, wherein the fifth AND gate has a first input terminal for receiving the inverted data signal, a second input terminal for receiving the first delay data signal, a third input terminal for receiving the inverted register signal, and an output terminal, wherein the inverted data signal has a complementary logic level to that of the data signal, and wherein the inverted register signal has a complementary logic level to that of the register signal; and a third OR gate, wherein the third OR gate has a first input terminal coupled to the output terminal of the fourth AND gate, a second input terminal coupled to the output terminal of the fifth AND gate, and an output terminal for outputting the down control signal.

In some embodiments, the phase detector further includes: a clock tuning circuit, delaying the first delay clock signal so as to generate a second delay clock signal, wherein a delay time of the clock tuning circuit is adjustable according to a third control signal and a fourth control signal; a data tuning circuit, delaying the first delay data signal so as to generate a second delay data signal, wherein a delay time of the data tuning circuit is adjustable according to the third control signal and the fourth control signal; and a second control circuit, generating the third control signal and the fourth control signal according to the first delay clock signal and the second delay clock signal; wherein the logic circuit generates the up control signal and the down control signal further according to the second delay data signal.

In some embodiments, each of the clock tuning circuit and the data tuning circuit includes a delay compensation circuit, wherein the delay compensation circuit includes: a compensation delay unit, delaying a compensation input signal so as to generate a compensation output signal; wherein a delay time of the compensation delay unit is adjustable according to the third control signal and the fourth control signal, wherein for the delay compensation circuit of the clock tuning circuit, the compensation input signal is the first delay clock signal and the compensation output signal is the second delay clock signal, and wherein for the delay compensation circuit of the data tuning circuit, the compensation input signal is the first delay data signal and the compensation output signal is the second delay data signal.

In some embodiments, the compensation delay unit includes: a seventh P-type transistor, wherein the seventh P-type transistor has a control terminal, a first terminal coupled to a supply voltage, and a second terminal coupled to a tenth node; an eighth P-type transistor, wherein the eighth P-type transistor has a control terminal, a first terminal coupled to the tenth node, and a second terminal coupled to an eleventh node; a seventh N-type transistor, wherein the seventh N-type transistor has a control terminal, a first terminal coupled to a twelfth node, and a second terminal coupled to the eleventh node; an eighth N-type transistor, wherein the eighth N-type transistor has a control terminal, a first terminal coupled to a ground voltage, and a second terminal coupled to the twelfth node; and a second inverter, wherein the second inverter has an input terminal coupled to the eleventh node, and an output terminal for outputting the compensation output signal, wherein the control terminal of one of the seventh P-type transistor and the eighth P-type transistor is coupled to the compensation input signal, and the control terminal of the other one of the seventh P-type transistor and the eighth P-type transistor is coupled to the fourth control signal, wherein the control terminal of one of the seventh N-type transistor and the eighth N-type transistor is coupled to the compensation input signal, and the control terminal of the other one of the seventh N-type transistor and the eighth N-type transistor is coupled to the third control signal.

In some embodiments, the second control circuit includes a slow controller which includes: a fifth D flip-flop, wherein the fifth D flip-flop has a data terminal, a clock terminal for receiving an inverted first delay clock signal, an output terminal for outputting a first slow signal, and an inverted output terminal fed back to the data terminal, wherein the inverted first delay clock signal has a complementary logic level to that of the first delay clock signal; and a sixth D flip-flop, wherein the sixth D flip-flop has a data terminal, a clock terminal for receiving the first delay clock signal, an output terminal for outputting a second slow signal, and an inverted output terminal fed back to the data terminal.

In some embodiments, the second control circuit further includes a third tuner which includes: a sixth AND gate, wherein the sixth AND gate has a first input terminal for receiving the second delay clock signal, a second input terminal for receiving an inverted first slow signal, a third input terminal for receiving an inverted second slow signal, and an output terminal for outputting a third gate control signal, wherein the inverted first slow signal has a complementary logic level to that of the first slow signal, wherein the inverted second slow signal has a complementary logic level to that of the second slow signal; an eleventh N-type transistor, wherein the eleventh N-type transistor has a control terminal coupled to the third gate control signal, a first terminal, and a second terminal coupled to a third control node, wherein a third current is drawn from the first terminal of the eleventh N-type transistor; a third capacitor, coupled between the third control node and the ground voltage, wherein the third control node is arranged for outputting the third control signal; and a third switch, coupled between a supply voltage and the third control node, wherein the third switch is selectively closed or opened according to a switch control signal.

In some embodiments, the second control circuit further includes a fourth tuner which includes: a second NAND gate, wherein the second NAND gate has a first input terminal for receiving the second delay clock signal, a second input terminal for receiving the first slow signal, a third input terminal for receiving the second slow signal, and an output terminal for outputting a fourth gate control signal at a sixteenth node; an eleventh P-type transistor, wherein the eleventh P-type transistor has a control terminal coupled to the fourth gate control signal, a first terminal, and a second terminal coupled to a fourth control node, wherein a fourth current is supplied to the first terminal of the eleventh P-type transistor; a fourth capacitor, coupled between the fourth control node and the ground voltage, wherein the fourth control node is arranged for outputting the fourth control signal; and a fourth switch, coupled between the fourth control node and the ground voltage, wherein the fourth switch is selectively closed or opened according to the switch control signal.

In some embodiments, the logic circuit includes an up control combination circuit which includes: a seventh AND gate, wherein the seventh AND gate has a first input terminal for receiving the data signal, a second input terminal for receiving the second delay data signal, a third input terminal for receiving an inverted register signal, and an output terminal, wherein the inverted register signal has a complementary logic level to that of the register signal; an eighth AND gate, wherein the eighth AND gate has a first input terminal for receiving an inverted data signal, a second input terminal for receiving an inverted second delay data signal, a third input terminal for receiving the register signal, and an output terminal, wherein the inverted data signal has a complementary logic level to that of the data signal, and wherein the inverted second delay data signal has a complementary logic level to that of the second delay data signal; and a fourth OR gate, wherein the fourth OR gate has a first input terminal coupled to the output terminal of the seventh AND gate, a second input terminal coupled to the output terminal of the eighth AND gate, and an output terminal for outputting the up control signal.

In some embodiments, the logic circuit includes a down control combination circuit which includes: a ninth AND gate, wherein the ninth AND gate has a first input terminal for receiving the data signal, a second input terminal for receiving the inverted second delay data signal, a third input terminal for receiving the register signal, and an output terminal, wherein the inverted second delay data signal has a complementary logic level to that of the second delay data signal; a tenth AND gate, wherein the tenth AND gate has a first input terminal for receiving the inverted data signal, a second input terminal for receiving the second delay data signal, a third input terminal for receiving the inverted register signal, and an output terminal, wherein the inverted data signal has a complementary logic level to that of the data signal, and wherein the inverted register signal has a complementary logic level to that of the register signal; and a fifth OR gate, wherein the fifth OR gate has a first input terminal coupled to the output terminal of the ninth AND gate, a second input terminal coupled to the output terminal of the tenth AND gate, and an output terminal for outputting the down control signal.

BRIEF DESCRIPTION OF DRAWINGS

The invention can be more fully understood by reading the subsequent detailed description and examples with references made to the accompanying drawings, wherein:

FIG. 7A is a diagram of signal waveforms of a first tuner and a second tuner according to an embodiment of the invention;

DETAILED DESCRIPTION OF THE INVENTION

In order to illustrate the purposes, features and advantages of the invention, the embodiments and figures of the invention are described in detail as follows.

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". The term "substantially" means the value is within an acceptable error range. One skilled in the art can solve the technical problem within a predetermined error range and achieve the proposed technical performance. Also, the term "couple" is intended to mean either an indirect or direct electrical connection. Accordingly, if one device is coupled to another device, that connection may be through a direct electrical connection, or through an indirect electrical connection via other devices and connections.

Figure 1:
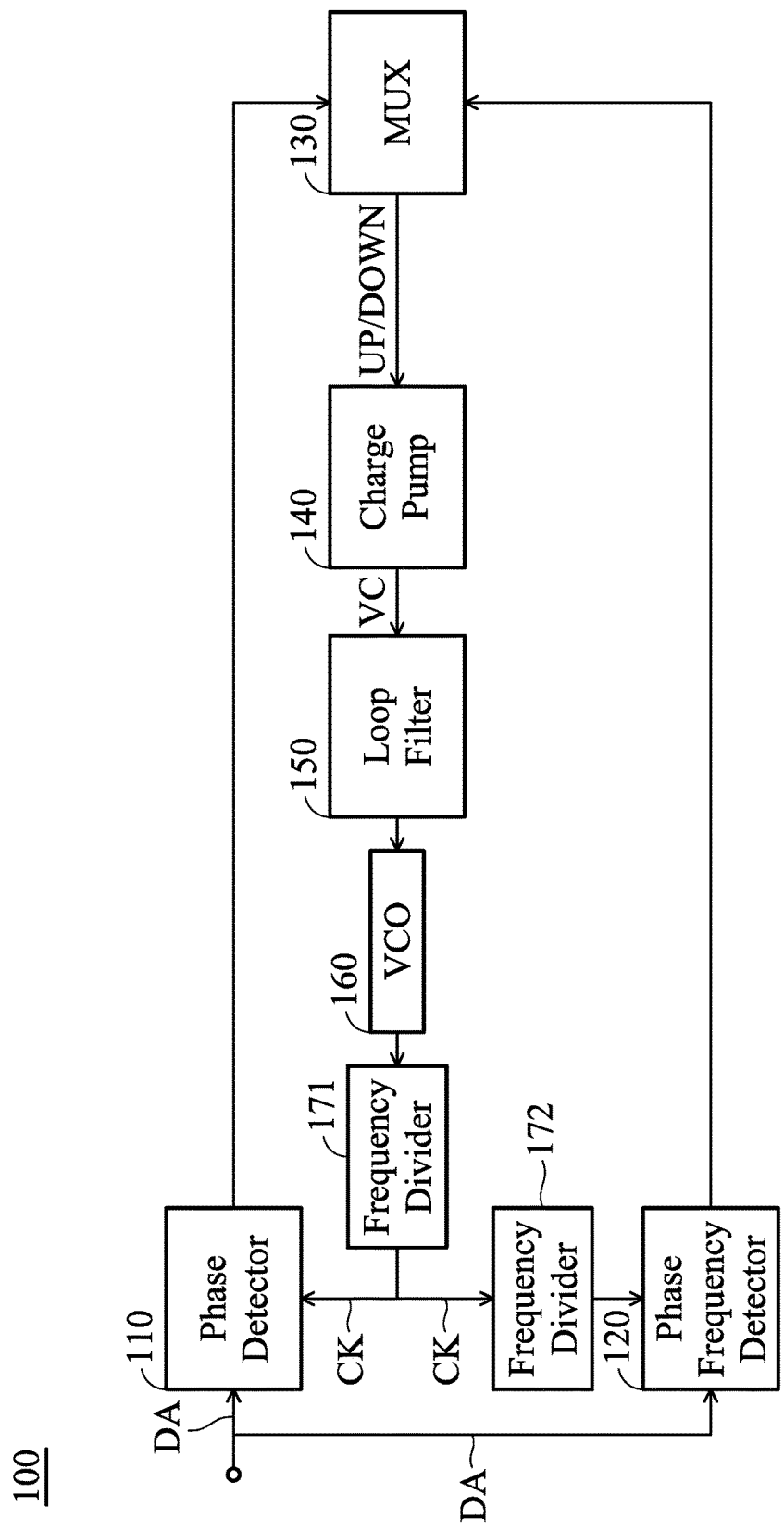
FIG. 1 is a diagram of a CDR (Clock Data Recovery) circuit according to an embodiment of the invention.

FIG. 1 is a diagram of a CDR (Clock Data Recovery) circuit 100 according to an embodiment of the invention. As shown in FIG. 1, the CDR circuit 100 includes a phase detector 110, a phase frequency detector 120, an MUX (Multiplexer) 130, a charge pump 140, a loop filter 150, a VCO (Voltage-Controlled Oscillator) 160, and two frequency dividers 171 and 172. The clock signal CK may be the clock recovered from the data signal DA by the CDR circuit 100. The CDR circuit 100 operates in two different modes. The data signal DA is inputted to both the phase detector 110 and the phase frequency detector 120. In a frequency lock mode, the MUX 130 switches to receive input from the phase frequency detector 120, and a lower-half signal loop is formed from the phase frequency detector 120 through the charge pump 140 and the loop filter 150 to the VCO 160, so as to lock to the frequency of the data signal DA according to a preamble during an initial data sequence of the data signal DA (such as a sequence of alternating bits of 101010, which makes it easier to lock to the desired data clock). On the other hand, in a real data mode, the MUX 130 switches to receive input from the phase detector 110, and an upper-half signal loop is formed from the phase detector 110 through the charge pump 140 and the loop filter 150 to the VCO 160, so as to lock to the frequency of the data signal DA according to actual data. Ideally, rising edges of the clock signal CK should be at the central points of the bit pulses of the data signal DA to ensure that the corresponding data may be read correctly. A CDR circuit 100 with a conventional design will often have the problem of serious jitters in its recovered clock, particularly during the real data mode. Accordingly, the invention proposes a novel phase detector 110 for stabilizing the output control voltage VC of the charge pump 140. Typical structures of the MUX, the charge pump, the loop filter, the VCO, and the frequency dividers are well known to those skilled in the art, and will not be described here.

Figure 2:
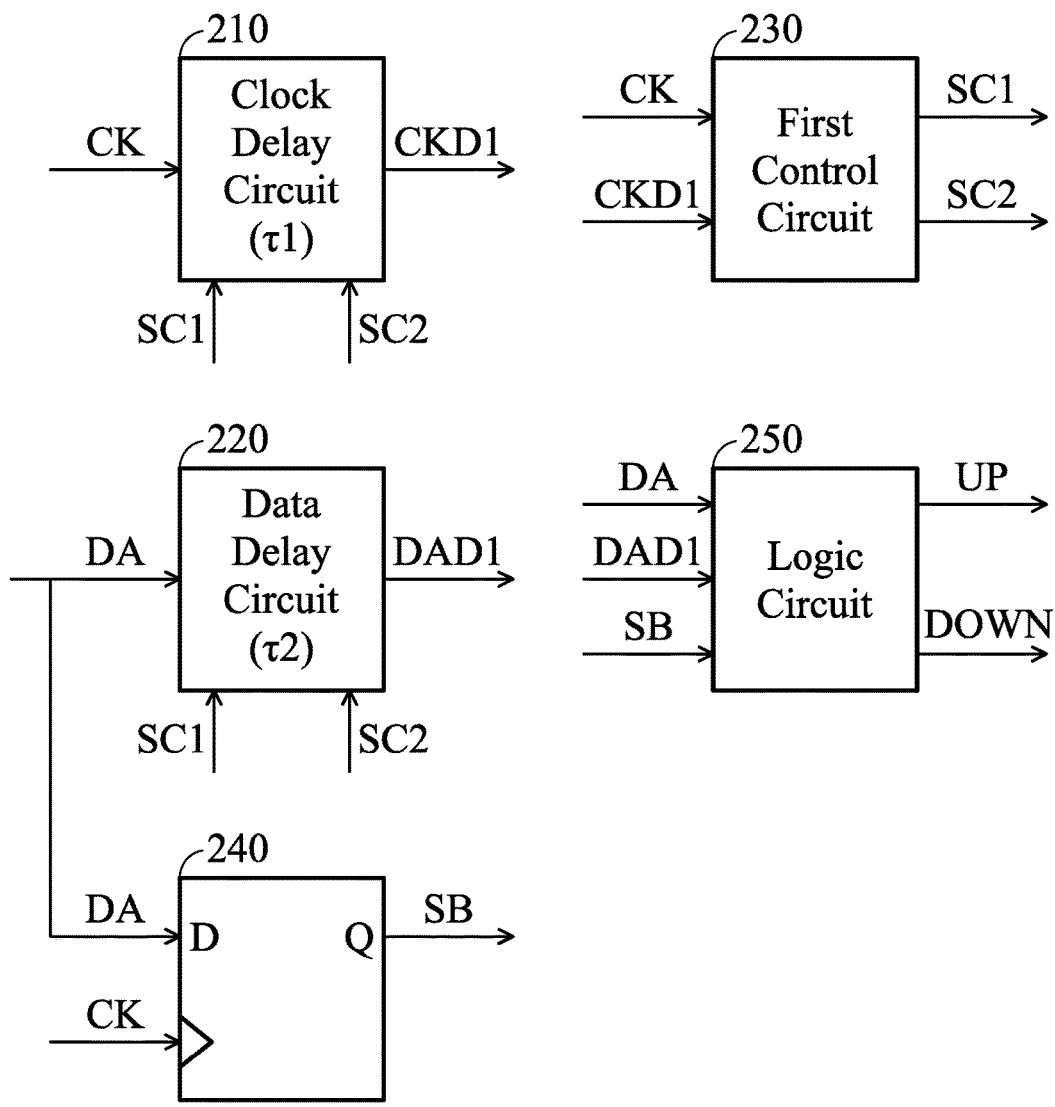
FIG. 2 is a diagram of a phase detector according to an embodiment of the invention.

FIG. 2 is a diagram of a phase detector 200 according to an embodiment of the invention. The phase detector 200 may be applied in the CDR circuit 100 of FIG. 1. As shown in FIG. 2, the phase detector 200 includes a clock delay circuit 210, a data delay circuit 220, a first control circuit 230, a main D flip-flop 240, and a logic circuit 250. A clock signal CK may be the recovered clock from the CDR circuit 100. A data signal DA may be the input data to the CDR circuit 100. The clock delay circuit 210 delays the clock signal CK for a delay time $\tau 1$ so as to generate a first delay clock signal CKD1, and the delay time $\tau 1$ of the clock delay circuit 210 is adjustable according to a first control signal SC1 and a second control signal SC2. The data delay circuit 220 delays the data signal DA for a delay time $\tau 2$ so as to generate a first delay data signal DAD1, and the delay time $\tau 2$ of the data delay circuit 220 is adjustable according to the first control signal SC1 and the second control signal SC2. The first control circuit 230 generates the first control signal SC1 and the second control signal SC2 according to the clock signal CK and the first delay clock signal CKD1. The main D flip-flop 240 generates a register signal SB according to the data signal DA and the clock signal CK. For example, the main D flip-flop 240 may have a data terminal (D) for receiving the data signal DA, a clock terminal (Triangle Symbol) for receiving the clock signal CK, and an output terminal (Q) for outputting the register signal SB. The logic circuit 250 generates an up control signal UP and a down control signal DOWN according to the data signal DA, the first delay data signal DAD1, and the register signal SB so as to control the charge pump 140 of the CDR circuit 100. It should be noted that the voltage level of the output control voltage VC of the charge pump 140 is determined by the up control signal UP and the down control signal DOWN.

The following embodiments describe the structures and circuits of the phase detector 200 (or 110). It should be understood that the following figures and descriptions are merely exemplary, rather than limitations of the invention.

Figure 3:
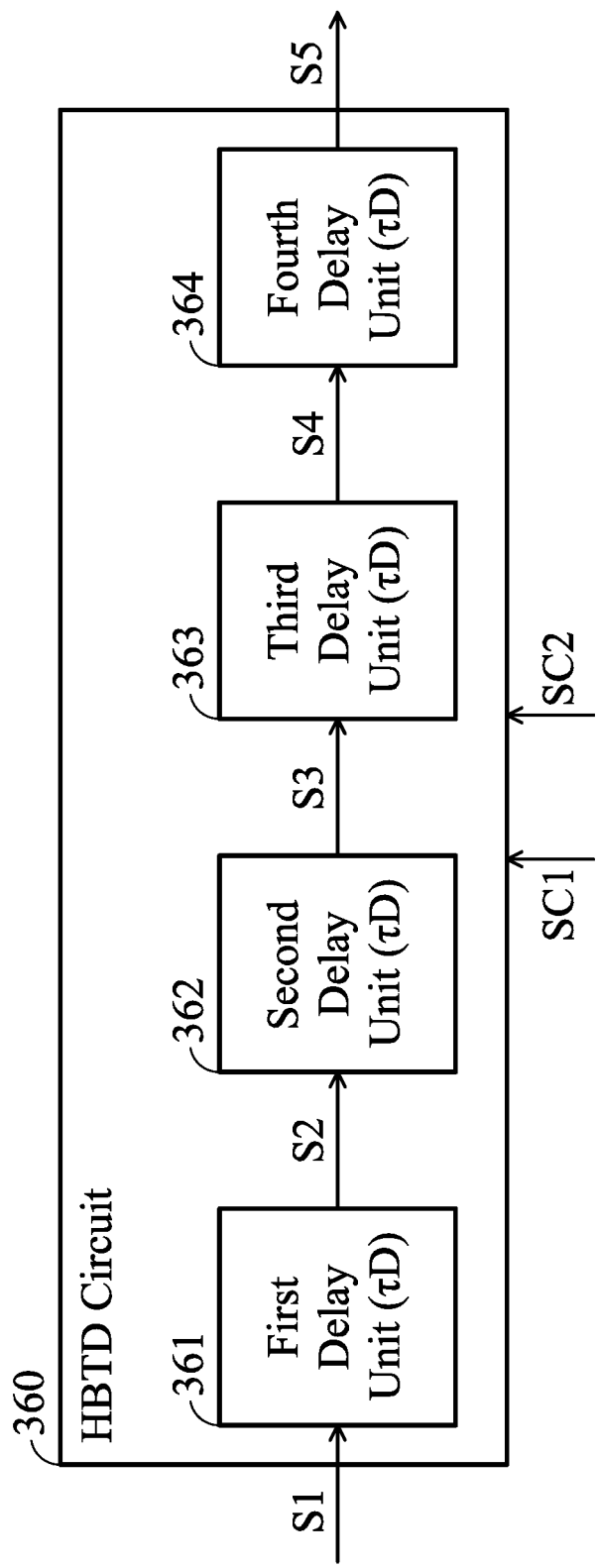
FIG. 3 is a diagram of an HBTD (Half Bit-Time Delay) circuit according to an embodiment of the invention.

In some embodiments, each of the clock delay circuit 210 and the data delay circuit 220 includes an HBTD (Half Bit-Time Delay) circuit 360. FIG. 3 is a diagram of the HBTD circuit 360 according to an embodiment of the invention. In the embodiment of FIG. 3, the HBTD circuit 360 includes a first delay unit 361, a second delay unit 362, a third delay unit 363, and a fourth delay unit 364. The first delay unit 361 delays a first signal S1 received at a HBTD input for a delay time $\tau D$ so as to generate a second signal S2. The second delay unit 362 delays the second signal S2 for the delay time $\tau D$ so as to generate a third signal S3. The third delay unit 363 delays the third signal S3 for the delay time $\tau D$ so as to generate a fourth signal S4. The fourth delay unit 364 delays the fourth signal S4 for the delay time $\tau D$ so as to generate a fifth signal S5 at a HBTD output. The delay time $\tau D$ of each of the first delay unit 361, the second delay unit 362, the third delay unit 363, and the fourth delay unit 364 is adjustable according to the first control signal SC1 and the second control signal SC2. For the HBTD circuit 360 of the clock delay circuit 210, the first signal S1 is the clock signal CK, and the fifth signal S5 is the first delay clock signal CKD1. Alternatively, for the HBTD circuit 360 of the data delay circuit 220, the first signal S1 is the data signal DA, and the fifth signal S5 is the first delay data signal DAD1. It should be understood that the HBTD circuit 360 may include more or fewer delay units, such as 2, 3, 5, 6, 7 or more delay units in other embodiments, although there are exactly 4 delay units displayed in FIG. 3.

Figure 4:
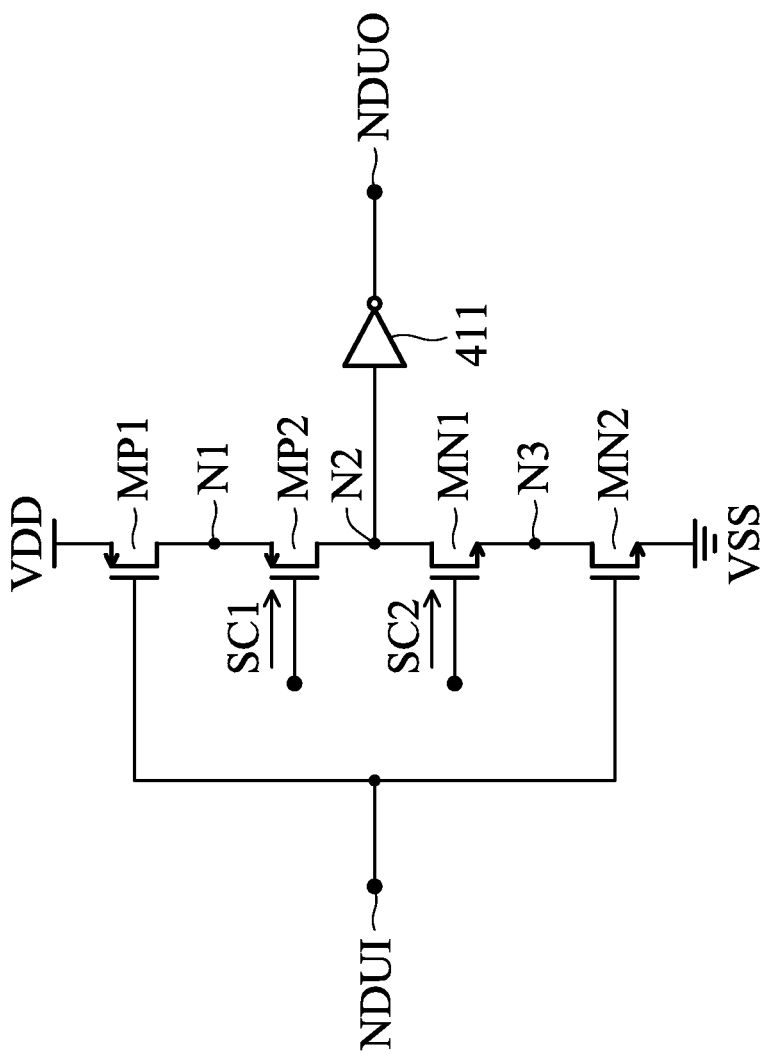
FIG. 4 is a diagram of a delay unit according to an embodiment of the invention.

FIG. 4 is a diagram of a delay unit according to an embodiment of the invention. In the embodiment of FIG. 4, each of the first delay unit 361, the second delay unit 362, the third delay unit 363, and the fourth delay unit 364 includes a first PMOS transistor (P-type Metal Oxide Semiconductor Field Effect Transistor) MP1, a second PMOS transistor MP2, a first NMOS transistor (N-type Metal Oxide Semiconductor Field Effect Transistor) MN1, a second NMOS transistor MN2, and a first inverter 411. Each delay unit has a delay unit input node NDUI and a delay unit output node NDUO. When these delay units are coupled in series, the delay unit input node NDUI of one delay unit may be coupled to the delay unit output node NDUO of its previous delay unit. For example, the delay unit input node NDUI of the second delay unit 362 may be coupled to the delay unit output node NDUO of the first delay unit 361, the delay unit input node NDUI of the third delay unit 363 may be coupled to the delay unit output node NDUO of the second delay unit 362, and so on. The first PMOS transistor MP1 has a control terminal coupled to the delay unit input node NDUI, a first terminal coupled to a supply voltage VDD, and a second terminal coupled to a first node N1. The second PMOS transistor MP2 has a control terminal for receiving the first control signal SC1, a first terminal coupled to the first node N1, and a second terminal coupled to a second node N2. The first NMOS transistor MN1 has a control terminal for receiving the second control signal SC2, a first terminal coupled to a third node N3, and a second terminal coupled to the second node N2. The second NMOS transistor MN2 has a control terminal coupled to the delay unit input node NDUI, a first terminal coupled to a ground voltage VSS, and a second terminal coupled to the third node N3. The first inverter 411 has an input terminal coupled to the second node N2, and an output terminal coupled to the delay unit output node NDUO. Since the resistances of the second PMOS transistor MP2 and the first NMOS transistor MN1 are adjustable according to the first control signal SC1 and the second control signal SC2, the delay time τD of each delay unit is tunable and determined by the first control circuit 230. Although the embodiment of FIG. 4 shows a configuration of the delay unit with the delay unit input node NDUI coupled to control terminals of both the topmost and bottommost transistors, in other embodiments, the delay unit may have other configurations, such as with the delay unit input node NDUI coupled to control terminals of transistors other than both the topmost and bottommost. In general, the control terminal of one of the two transistors coupled between the supply voltage VDD and the second node N2 may be coupled to the delay unit input node NDUI, while the control terminal of the other one of the two transistors coupled between the supply voltage VDD and the second node N2 may be coupled to the first control signal SC1; in general, the control terminal of one of the two transistors coupled between the ground voltage VSS and the second node N2 may be coupled to the delay unit input node NDUI, while the control terminal of the other one of the two transistors coupled between the ground voltage VSS and the second node N2 may be coupled to the second control signal SC2.

Figure 5A:
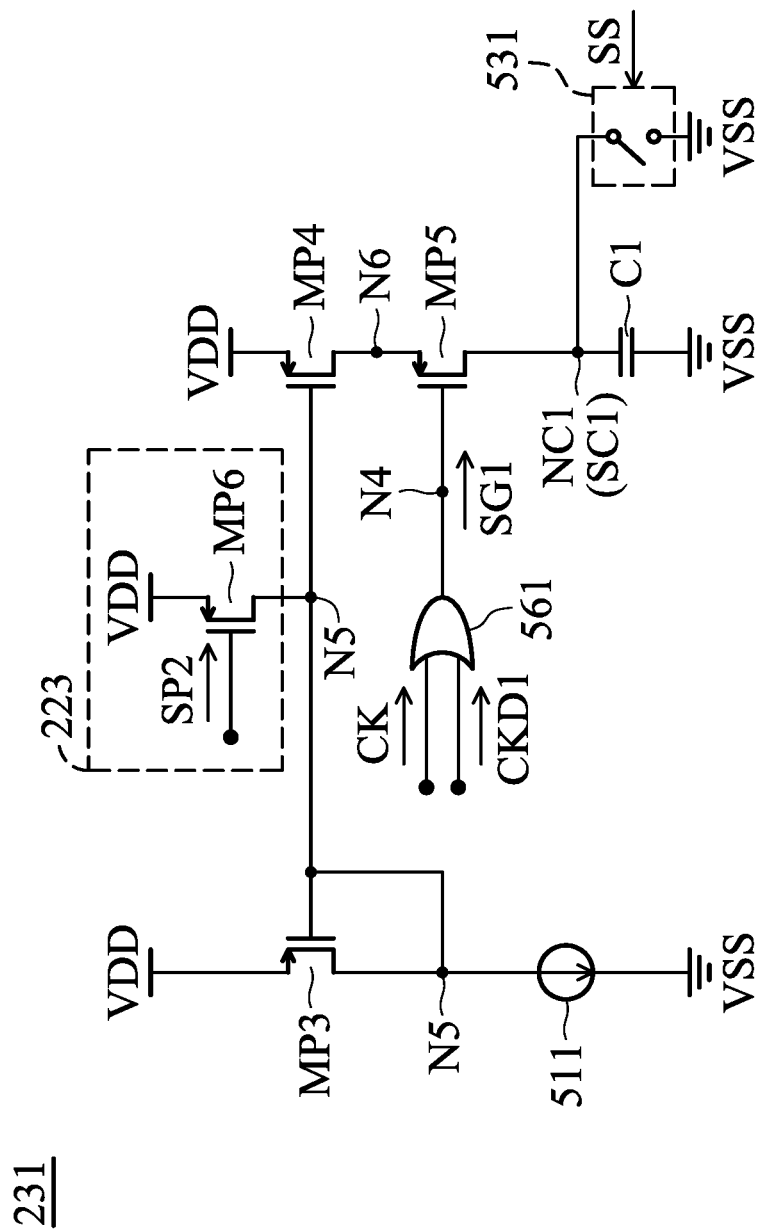
FIG. 5A is a diagram of a first tuner according to an embodiment of the invention.

In some embodiments, the first control circuit 230 includes a first tuner 231. FIG. 5A is a diagram of the first tuner 231 according to an embodiment of the invention. In the embodiment of FIG. 5A, the first tuner 231 includes a first OR gate 561, a third PMOS transistor (P-type Metal Oxide Semiconductor Field Effect Transistor) MP3, a fourth PMOS transistor MP4, a fifth PMOS transistor MP5, a first current sink 511, a first capacitor C1, and a first switch 531. The first OR gate 561 has a first input terminal for receiving the clock signal CK, a second input terminal for receiving the first delay clock signal CKD1, and an output terminal for outputting a first gate control signal SG1 at a fourth node N4. The third PMOS transistor MP3 has a control terminal coupled to a fifth node N5, a first terminal coupled to the supply voltage VDD, and a second terminal coupled to the fifth node N5. The first current sink 511 draws a first current from the fifth node N5. The fourth PMOS transistor MP4 has a control terminal coupled to the fifth node N5, a first terminal coupled to the supply voltage VDD, and a second terminal coupled to a sixth node N6, so as to form a current mirror with the third PMOS transistor MP3, and to mirror the first current drawn from the fifth node N5 to the sixth node N6. The fifth PMOS transistor MP5 has a control terminal coupled to the fourth node N4, a first terminal coupled to the sixth node N6, and a second terminal coupled to a first control node NC1. The first control node NC1 is arranged for outputting the first control signal SC1. The first capacitor C1 is coupled between the first control node NC1 and the ground voltage VSS. The first switch 531 is coupled between the first control node NC1 and the ground voltage VSS. The first switch 531 is selectively closed (conducting) or opened (not conducting) according to a switch control signal SS. For example, if the switch control signal SS has a high logic level, the first switch 531 will be closed, and if the switch control signal SS has a low logic level, the first switch 531 will be opened.

Figure 5B:
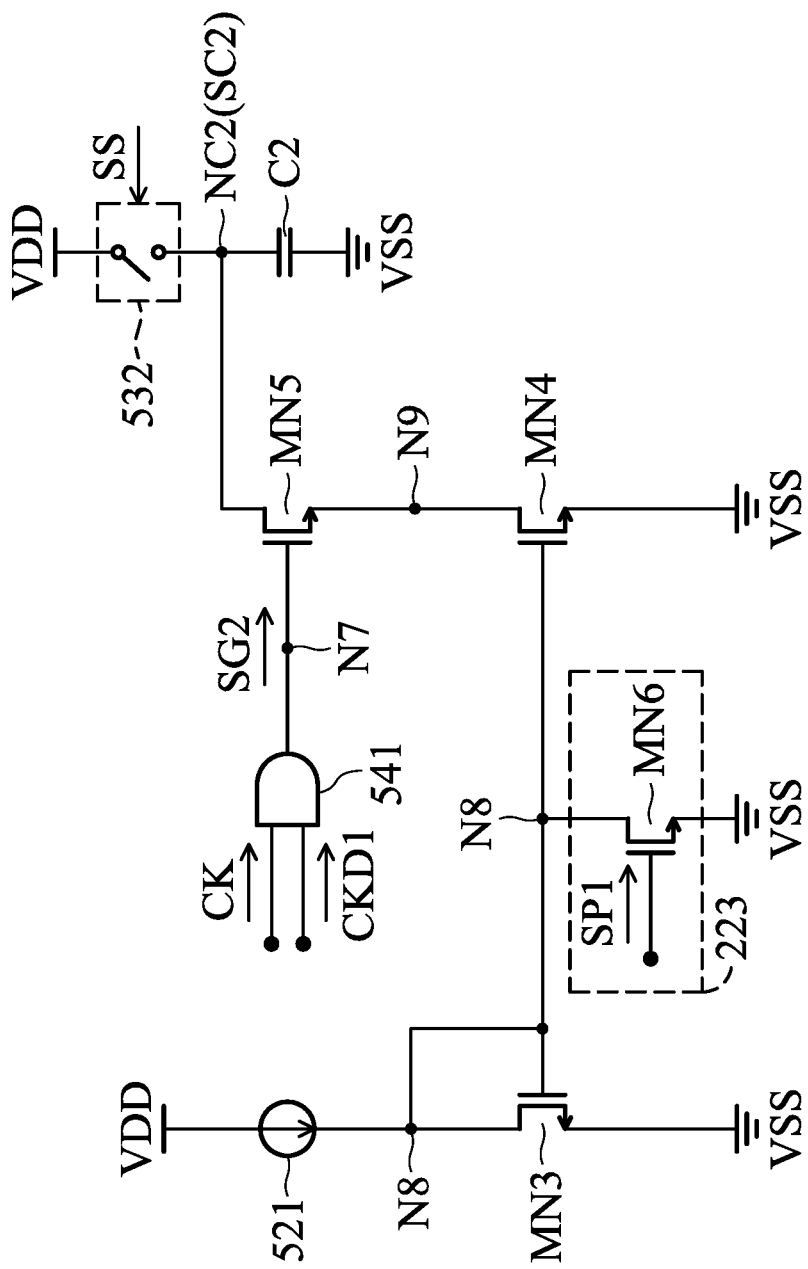
FIG. 5B is a diagram of a second tuner according to an embodiment of the invention.

In some embodiments, the first control circuit 230 includes a second tuner 232. FIG. 5B is a diagram of the second tuner 232 according to an embodiment of the invention. In the embodiment of FIG. 5B, the second tuner 232 includes a first AND gate 541, a third NMOS transistor (N-type Metal Oxide Semiconductor Field Effect Transistor) MN3, a fourth NMOS transistor MN4, a fifth NMOS transistor MN5, a first current source 521, a second capacitor C2, and a second switch 532. The first AND gate 541 has a first input terminal for receiving the clock signal CK, a second input terminal for receiving the first delay clock signal CKD1, and an output terminal for outputting a second gate control signal SG2 at a seventh node N7. The third NMOS transistor MN3 has a control terminal coupled to an eighth node N8, a first terminal coupled to the ground voltage VSS, and a second terminal coupled to the eighth node N8. The first current source 521 supplies a second current to the eighth node N8. The fourth NMOS transistor MN4 has a control terminal coupled to the eighth node N8, a first terminal coupled to the ground voltage VSS, and a second terminal coupled to a ninth node N9, so as to form a current mirror with the third NMOS transistor MN3, and to mirror the second current supplied to the eighth node N8 to the ninth node N9. The fifth NMOS transistor MN5 has a control terminal coupled to the seventh node N7, a first terminal coupled to the ninth node N9, and a second terminal coupled to a second control node NC2. The second control node NC2 is arranged for outputting the second control signal SC2. The second capacitor C2 is coupled between the second control node NC2 and the ground voltage VSS. The second switch 532 is coupled between the supply voltage VDD and the second control node NC2. The second switch 532 is selectively closed (conducting) or opened (not conducting) according to the switch control signal SS. For example, if the switch control signal SS has a high logic level, the second switch 532 will be closed, and if the switch control signal SS has a low logic level, the second switch 532 will be opened.

Initially, the first switch 531 and the second switch 532 are both temporarily closed, such that the voltage level of the first control signal SC1 is initialized to be the ground voltage VSS, and the voltage level of the second control signal SC2 is initialized to be the supply voltage VDD. At this time, the delay time τD of each delay unit of the HBTD circuit 360 is initially minimized because the second PMOS transistor MP2 and the first NMOS transistor MN1 have the lowest resistance. Next, during the tuning process, the first switch 531 and the second switch 532 are both opened and kept open, and the first tuner 231 and the second tuner 232 of the first control circuit 230 start to fine-tune the voltage levels of the first control signal SC1 and the second control signal SC2, which adjust the resistances of the second PMOS transistor MP2 and the first NMOS transistor MN1, so as to control the total delay time of the HBTD circuit 360. Ideally, the final total delay time of the HBTD circuit 360, for both the clock delay circuit 210 and the data delay circuit 220, should be exactly equal to half of the bit-time (i.e., T/2). The bit-time T may mean the pulse width of one bit of the data signal DA.

Figure 5C:
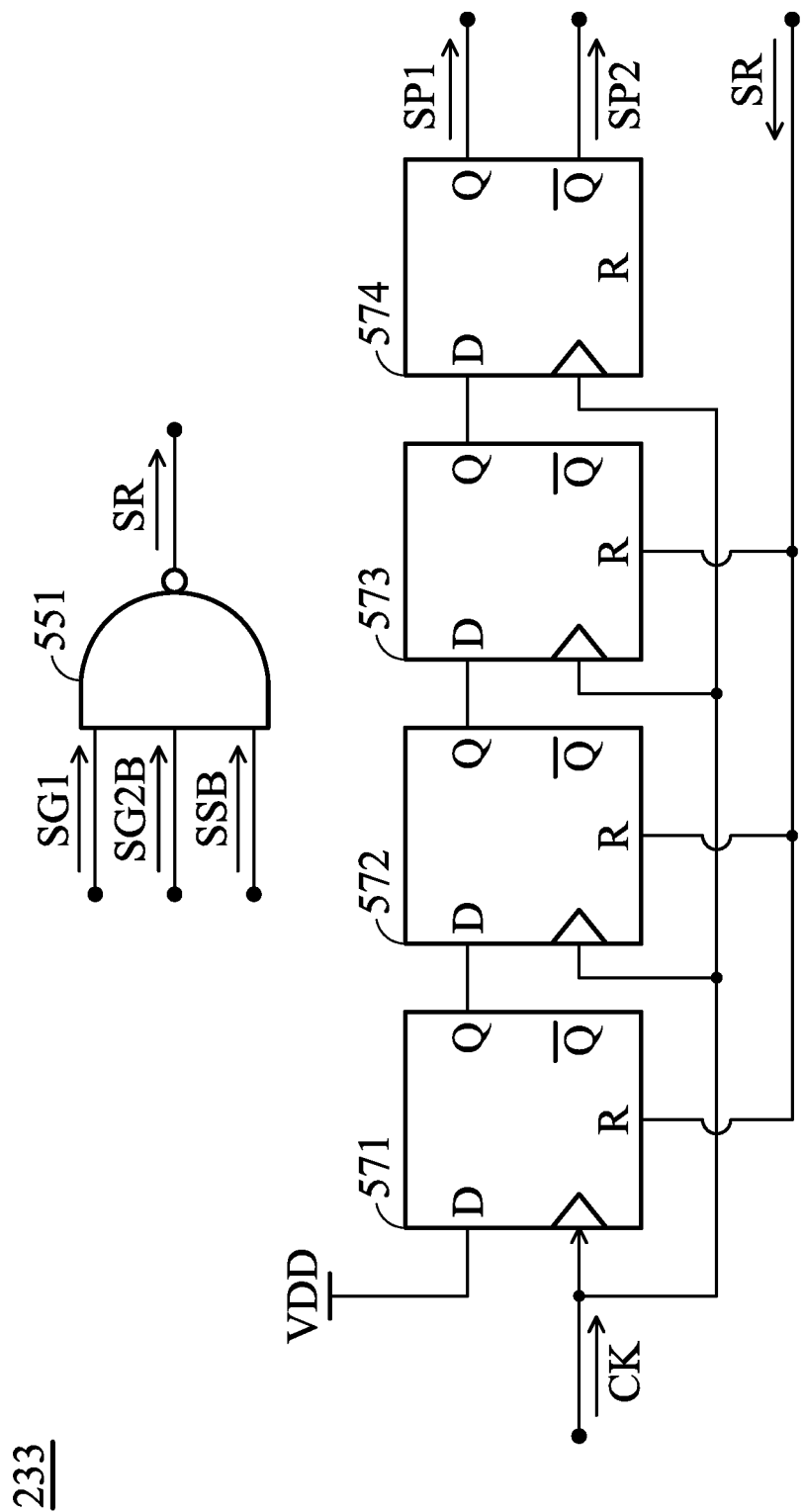
FIG. 5C is a diagram of a power-saving circuit according to an embodiment of the invention.

In some embodiments, the first control circuit 230 includes a power-saving circuit 233. FIG. 5C is a diagram of the power-saving circuit 233 according to an embodiment of the invention. In the embodiment of FIG. 5C, the power-saving circuit 233 includes a sixth NMOS transistor (N-type Metal Oxide Semiconductor Field Effect Transistor) MN6 (referring to FIG. 5B), a sixth PMOS transistor (P-type Metal Oxide Semiconductor Field Effect Transistor) MP6 (referring to FIG. 5A) (both not shown in FIG. 5C), a first NAND gate 551, a first D flip-flop 571, a second D flip-flop 572, a third D flip-flop 573, and a fourth D flip-flop 574. The sixth NMOS transistor MN6 has a control terminal for receiving a first power-saving signal SP1, a first terminal coupled to the ground voltage VSS, and a second terminal coupled to the eighth node N8. The sixth PMOS transistor MP6 has a control terminal for receiving a second power-saving signal SP2, a first terminal coupled to the supply voltage VDD, and a second terminal coupled to the fifth node N5. The first NAND gate 551 has a first input terminal for receiving the first gate control signal SG1, a second input terminal for receiving an inverted second gate control signal SG2B, a third input terminal for receiving an inverted switch control signal SSB, and an output terminal for outputting a reset signal SR. The inverted second gate control signal SG2B has a complementary logic level to that of the second gate control signal SG2, and may be generated by using an inverter. The inverted switch control signal SSB has a complementary logic level to that of the switch control signal SS, and may be generated by using an inverter. The first D flip-flop 571 has a data terminal (D) for receiving the supply voltage VDD, a clock terminal (Triangle Symbol) for receiving the clock signal CK, a reset terminal (R) for receiving the reset signal SR, and an output terminal (Q). The second D flip-flop 572 has a data terminal (D) coupled to the output terminal of the first D flip-flop 571, a clock terminal (Triangle Symbol) for receiving the clock signal CK, a reset terminal (R) for receiving the reset signal SR, and an output terminal (Q). The third D flip-flop 573 has a data terminal (D) coupled to the output terminal of the second D flip-flop 572, a clock terminal (Triangle Symbol) for receiving the clock signal CK, a reset terminal (R) for receiving the reset signal SR, and an output terminal (Q).

The fourth D flip-flop 574 has a data terminal (D) coupled to the output terminal of the third D flip-flop 573, a clock terminal (Triangle Symbol) for receiving the clock signal CK, an output terminal (Q) for outputting the first power-saving signal SP1, and an inverted output terminal (Q) for outputting the second power-saving signal SP2. It should be understood that the power-saving circuit 233 may include more or fewer D flip-flops, such as 2, 3, 5, 6, 7 or more D flip-flops in other embodiments, although there are exactly 4 D flip-flops displayed in FIG. 5C. The power-saving circuit 233 is an optional element for automatically shutting off the first tuner 231 and the second tuner 232 when N clock cycles have expired, so as to reduce the total power consumption of the phase detector 200. The above N may be equal to 4 in the embodiment of FIG. 5C, and it is adjustable and equal to the total number of D flip-flops of the power-saving circuit 233. In this embodiment, after 4 clock cycles, the first power-saving signal SP1 is outputted to be logic "1" (high voltage level) and the second power-saving signal SP2 is outputted to be logic "0" (low voltage level); therefore, the fifth node N5 is pulled up to the supply voltage VDD, and the eighth node N8 is pulled down to the ground voltage VSS, so that both the third PMOS transistor MP3 and the fourth PMOS transistor MP4 and both the third NMOS transistor MN3 and the fourth NMOS transistor MN4 are all turned off. Thus, power consumption may be reduced, and noise interferences to the first control signal SC1 and the second control signal SC2 may be avoided.

Figure 6A:
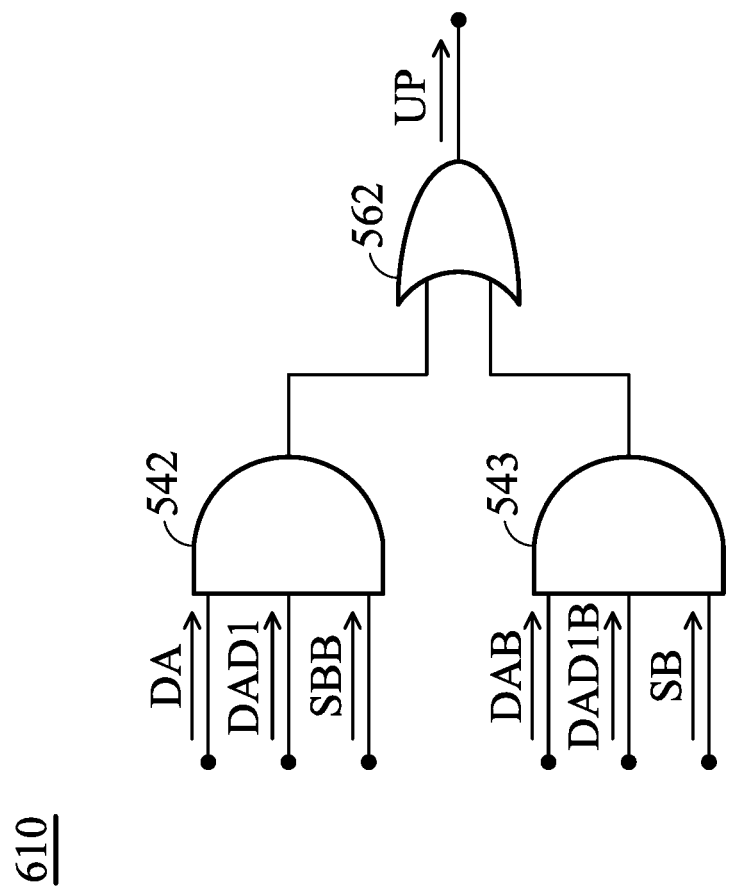
FIG. 6A is a diagram of an up control combination circuit according to an embodiment of the invention.

In some embodiments, the logic circuit 250 includes an up control combination circuit 610. FIG. 6A is a diagram of the up control combination circuit 610 according to an embodiment of the invention. In the embodiment of FIG. 6A, the up control combination circuit 610 includes a second AND gate 542, a third AND gate 543, and a second OR gate 562. The second AND gate 542 has a first input terminal for receiving the data signal DA, a second input terminal for receiving the first delay data signal DAD1, a third input terminal for receiving an inverted register signal SBB, and an output terminal. The inverted register signal SBB has a complementary logic level to that of the register signal SB, and may be generated by using an inverter. The third AND gate 543 has a first input terminal for receiving an inverted data signal DAB, a second input terminal for receiving an inverted first delay data signal DAD1B, a third input terminal for receiving the register signal SB, and an output terminal. The inverted data signal DAB has a complementary logic level to that of the data signal DA, and may be generated by using an inverter. The inverted first delay data signal DAD1B has a complementary logic level to that of the first delay data signal DAD1, and may be generated by using an inverter. The second OR gate 562 has a first input terminal coupled to the output terminal of the second AND gate 542, a second input terminal coupled to the output terminal of the third AND gate 543, and an output terminal for outputting the up control signal UP.

Figure 6B:
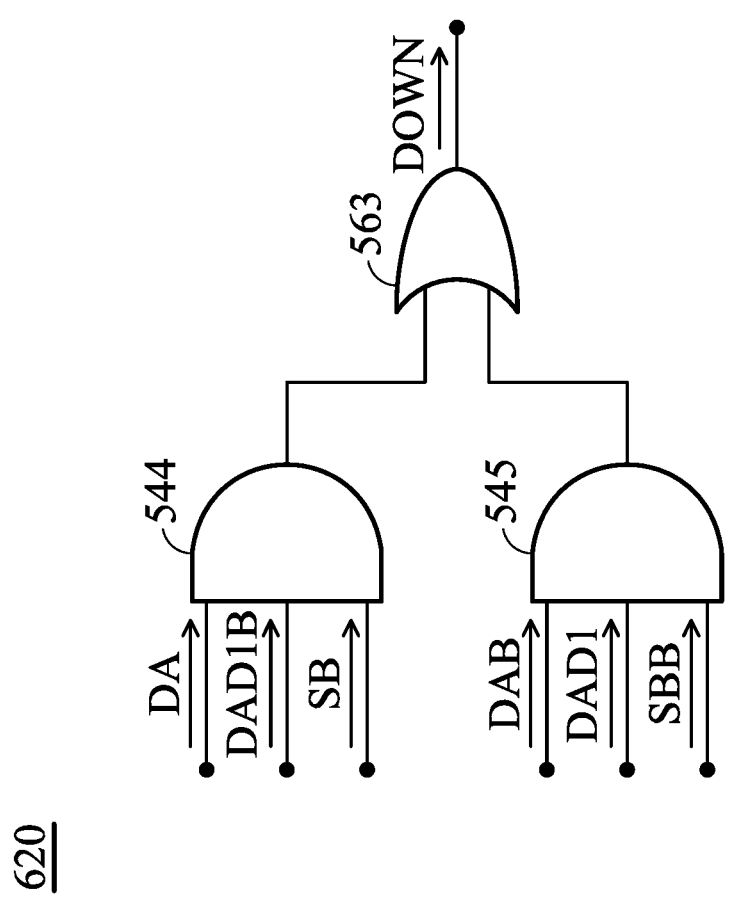
FIG. 6B is a diagram of a down control combination circuit according to an embodiment of the invention.

In some embodiments, the logic circuit 250 includes a down control combination circuit 620. FIG. 6B is a diagram of the down control combination circuit 620 according to an embodiment of the invention. In the embodiment of FIG. 6B, the down control combination circuit 620 includes a fourth AND gate 544, a fifth AND gate 545, and a third OR gate 563. The fourth AND gate 544 has a first input terminal for receiving the data signal DA, a second input terminal for receiving the inverted first delay data signal DAD1B, a third input terminal for receiving the register signal SB, and an output terminal. The fifth AND gate 545 has a first input terminal for receiving the inverted data signal DAB, a second input terminal for receiving the first delay data signal DAD1, a third input terminal for receiving the inverted register signal SBB, and an output terminal. The third OR gate 563 has a first input terminal coupled to the output terminal of the fourth AND gate 544, a second input terminal coupled to the output terminal of the fifth AND gate 545, and an output terminal for outputting the down control signal DOWN.

To be brief, in the embodiment of FIG. 6A and FIG. 6B, the up control signal UP and the down control signal DOWN are represented as the following logic equations (1) and (2).

$$UP = DA \cdot DAD1 \cdot \overline{SB} + \overline{DA} \cdot \overline{DAD1} \cdot SB \quad (1)$$

$$DOWN = DA \cdot \overline{DAD1} \cdot SB + \overline{DA} \cdot DAD1 \cdot \overline{SB} \quad (2)$$

where "UP" represents the logic level of the up control signal UP, "DOWN" represents the logic level of the down control signal DOWN, "DA" represents the logic level of the data signal DA, "DAD1" represents the logic level of the first delay data signal DAD1, "SB" represents the logic level of the register signal SB, "$\overline{DA}$" represents the logic level of the inverted data signal DAB, "$\overline{DAD1}$" represents the logic level of the inverted first delay data signal DAD1B, and "$\overline{SB}$" represents the logic level of the inverted register signal SBB. The charge pump 140 generates the output control voltage VC according to the up control signal UP and the down control signal DOWN by supplying current to (or drawing current from) the subsequent loop filter 150. The output control voltage VC is increased when the up control signal UP is at high voltage level (logic "1") and decreased when the down control signal DOWN is at high voltage level.

FIG. 7A is a diagram of signal waveforms of the first tuner 231 and the second tuner 232 according to an embodiment of the invention. Please refer to FIG. 5A, FIG. 5B, and FIG. 7A together. The first gate control signal SG1 and the second gate control signal SG2 are arranged for fine-tuning the voltage levels of the first control signal SC1 and the second control signal SC2, respectively. In the beginning, the delay time of the HBTD circuit 360 is minimized, and it results in the widest pulses of the first gate control signal SG1 (i.e., the low voltage pulses) and the second gate control signal SG2 (i.e., the high voltage pulses). Then, during the tuning process, the pulses of the first gate control signal SG1 and the second gate control signal SG2 become narrower and narrower over the time axis since the delay time increases. Finally, when the pulses of the first gate control signal SG1 and the second gate control signal SG2 completely disappear, each of the first control signal SC1 and the second control signal SC2 reaches a respective constant value, and the total delay time of the HBTD circuit 360, for both the clock delay circuit 210 and the data delay circuit 220, should become exactly equal to half of the bit-time (i.e., T/2). At this time, the first delay clock signal CKD1 lags the clock signal CK by half of the bit-time (i.e., T/2), and the first delay data signal DAD1 also lags the data signal DA by half of the bit-time (i.e., T/2).

Figure 7B:
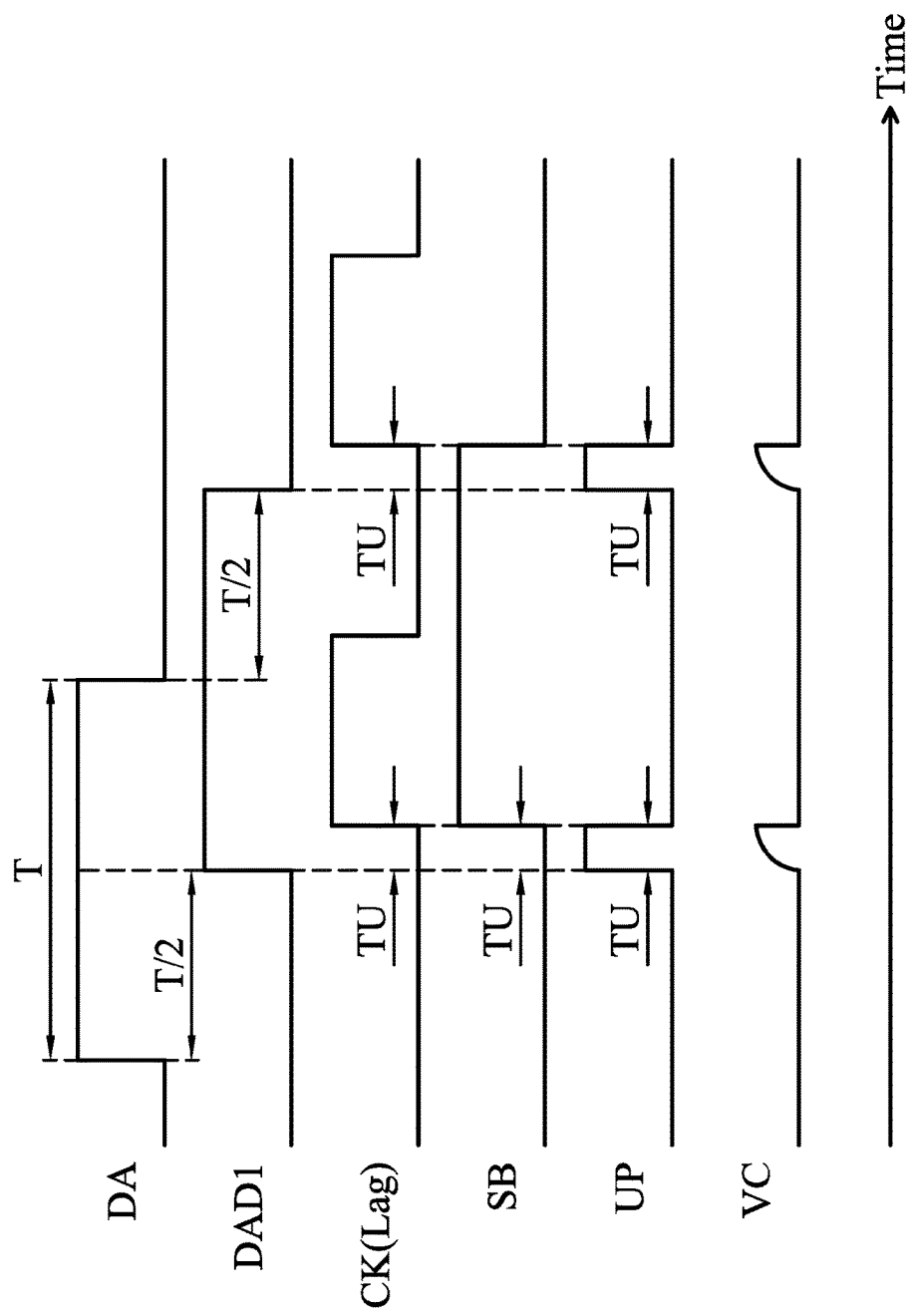
FIG. 7B is a diagram of signal waveforms of a phase detector when a clock signal lags, according to an embodiment of the invention.

FIG. 7B is a diagram of signal waveforms of the phase detector 200 when the clock signal CK lags, according to an embodiment of the invention. FIG. 7B describes a tuning process for suppressing the lagging recovered clock. As shown in FIG. 7B, when the rising edge of the clock signal CK lags the central point of the bit pulse of the data signal DA by a short time TU, it causes the up control signal UP outputted by the up control combination circuit 610 to generate some pulses, and each pulse merely has the width of the short time TU over the time axis. As a result, the output control voltage VC of the charge pump 140 becomes higher, and the frequency of the clock signal CK increases, so that the short time TU relative to the lagging recovered clock is gradually reduced to zero. With such a design, the phase detector 200 not only eliminates the short time TU relative to the lagging recovered clock but also maintains the output control voltage VC of the charge pump 140 at a relatively stable level because the up control signal UP is more stable than that of a conventional design (For the conventional design, the high logic duration of the up control signal is longer, and the output control voltage of the charge pump has a triangular waveform, which causes more output jitters in the recovered clock).

Figure 7C:
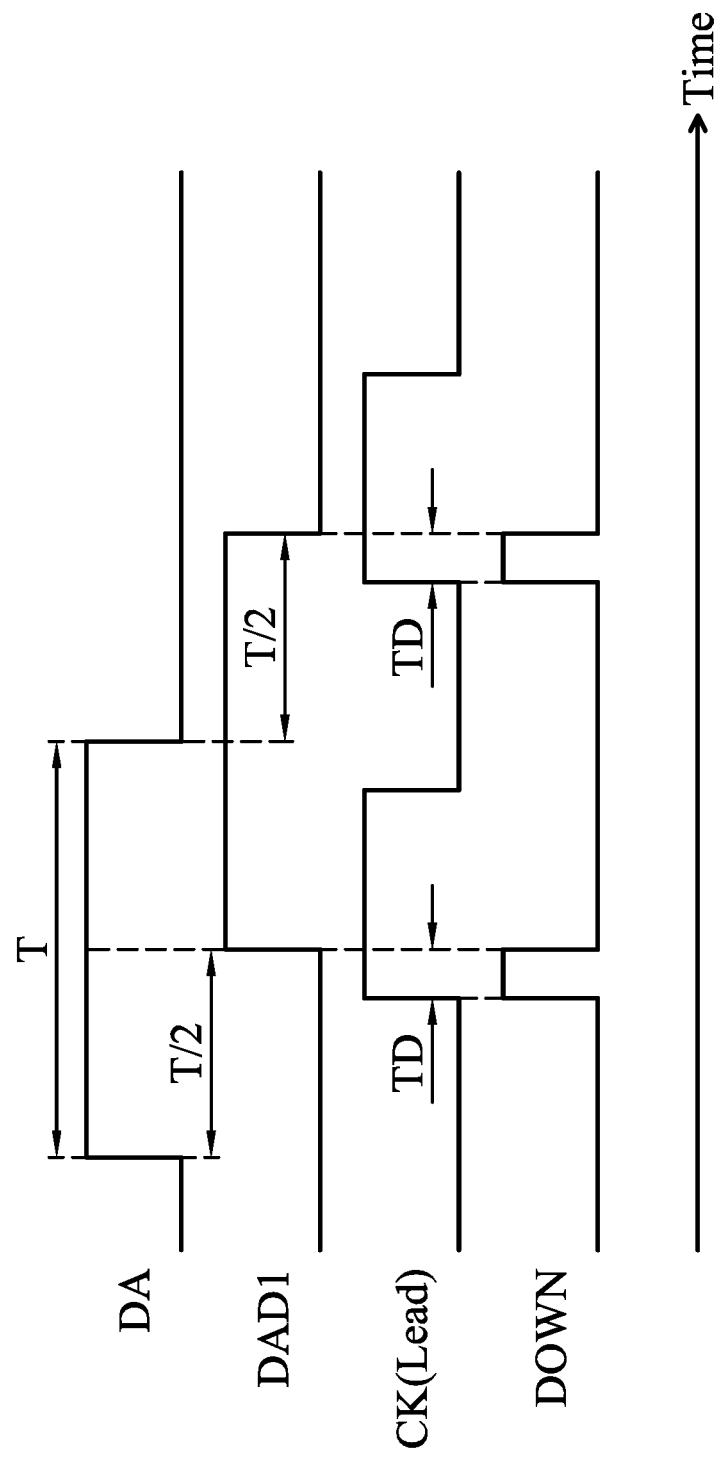
FIG. 7C is a diagram of signal waveforms of a phase detector when a clock signal leads, according to an embodiment of the invention.

FIG. 7C is a diagram of signal waveforms of the phase detector 200 when the clock signal CK leads, according to an embodiment of the invention. FIG. 7C describes a tuning process for suppressing the leading recovered clock. As shown in FIG. 7C, when the rising edge of the clock signal CK leads the central point of the bit pulse of the data signal DA by a short time TD, it causes the down control signal DOWN outputted by the down control combination circuit 620 to generate some pulses, and each pulse has the width of the short time TD over the time axis. As a result, the output control voltage VC of the charge pump 140 becomes lower, and the frequency of the clock signal CK decreases, so that the short time TU relative to the leading recovered clock is gradually reduced to zero. With such a design, the phase detector 200 not only eliminates the short time TU relative to the leading recovered clock but also maintains the output control voltage VC of the charge pump 140 at a relatively stable level because the down control signal DOWN is more stable than that of a conventional design (For the conventional design, the high logic duration of the down control signal is longer, and the output control voltage of the charge pump has a triangular waveform, which causes more output jitters in the recovered clock).

In addition, the main D flip-flop 240 of the phase detector 200 sometimes has a clock-to-output delay, which is a non-ideal delay between the clock signal CK and the register signal SB, and it reduces the accuracy of the recovered clock. This minor problem and the corresponding solution will be introduced in the following embodiments. That is to say, when locked, the first delay data signal DAD1 and the register signal SB are synchronized at the central points of the bit pulses of the data signal DA, but the clock signal CK may lead the central points by a small amount of time.

Figure 8:
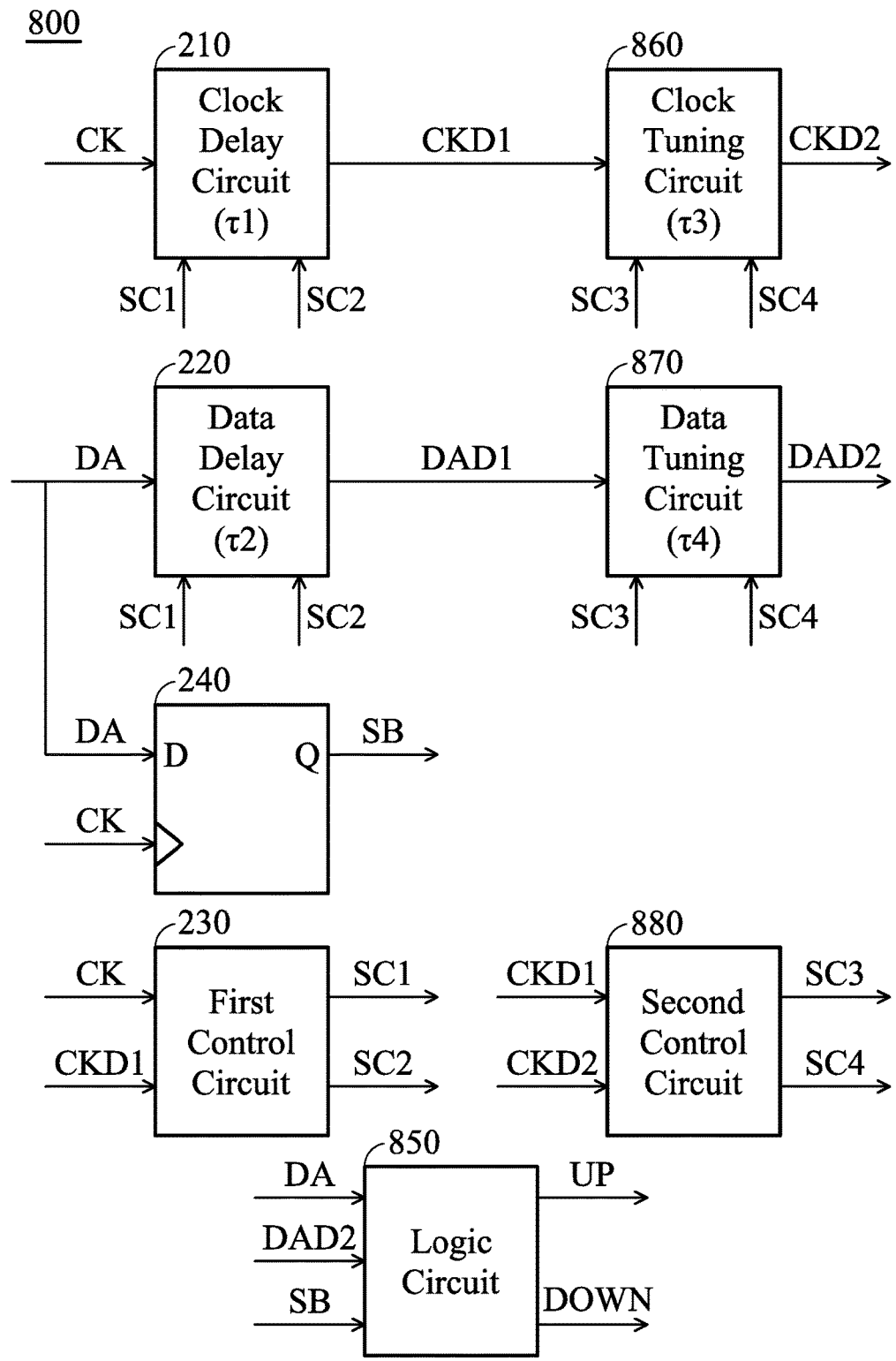
FIG. 8 is a diagram of a phase detector according to an embodiment of the invention.

FIG. 8 is a diagram of a phase detector 800 according to an embodiment of the invention. FIG. 8 is similar to FIG. 2. In the embodiment of FIG. 8, when compared with FIG. 2, the phase detector 800 further includes a clock tuning circuit 860, a data tuning circuit 870, and a second control circuit 880. The clock tuning circuit 860 delays the first delay clock signal CKD1 for a delay time τ3 so as to generate a second delay clock signal CKD2, and the delay time τ3 of the clock tuning circuit 860 is adjustable according to a third control signal SC3 and a fourth control signal SC4. The data tuning circuit 870 delays the first delay data signal DAD1 for a delay time τ4 so as to generate a second delay data signal DAD2, and the delay time τ4 of the data tuning circuit 870 is adjustable according to the third control signal SC3 and the fourth control signal SC4. The second control circuit 880 generates the third control signal SC3 and the fourth control signal SC4 according to the first delay clock signal CKD1 and the second delay clock signal CKD2. Specifically, a logic circuit 850 of the phase detector 800 generates a up control signal UP and a down control signal DOWN according to the data signal DA, the second delay data signal DAD2 (instead of the first delay data signal DAD1), and the register signal SB, so as to control the charge pump 140 of the CDR circuit 100.

Figure 9:
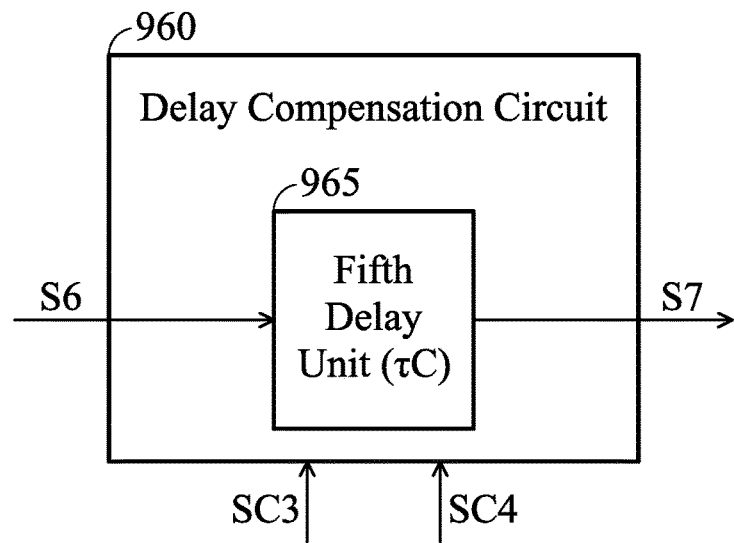
FIG. 9 is a diagram of a delay compensation circuit according to an embodiment of the invention.

In some embodiments, each of the clock tuning circuit 860 and the data tuning circuit 870 includes a delay compensation circuit 960. FIG. 9 is a diagram of the delay compensation circuit 960 according to an embodiment of the invention. In the embodiment of FIG. 9, the delay compensation circuit 960 includes a fifth delay unit 965. The fifth delay unit 965 delays a sixth signal S6 (i.e. a compensation input signal) for a delay time τC so as to generate a seventh signal S7 (i.e. a compensation output signal). The delay time τC of the fifth delay unit 965 is adjustable according to the third control signal SC3 and the fourth control signal SC4. For the delay compensation circuit 960 of the clock tuning circuit 860, the sixth signal S6 is the first delay clock signal CKD1, and the seventh signal S7 is the second delay clock signal CKD2. Alternatively, for the delay compensation circuit 960 of the data tuning circuit 870, the sixth signal S6 is the first delay data signal DAD1, and the seventh signal S7 is the second delay data signal DAD2. It should be understood that the delay compensation circuit 960 may include more delay units, such as 2, 3, 4, 5, 6, 7 or more delay units in other embodiments, although there is exactly 1 delay unit displayed in FIG. 9.

Figure 10:
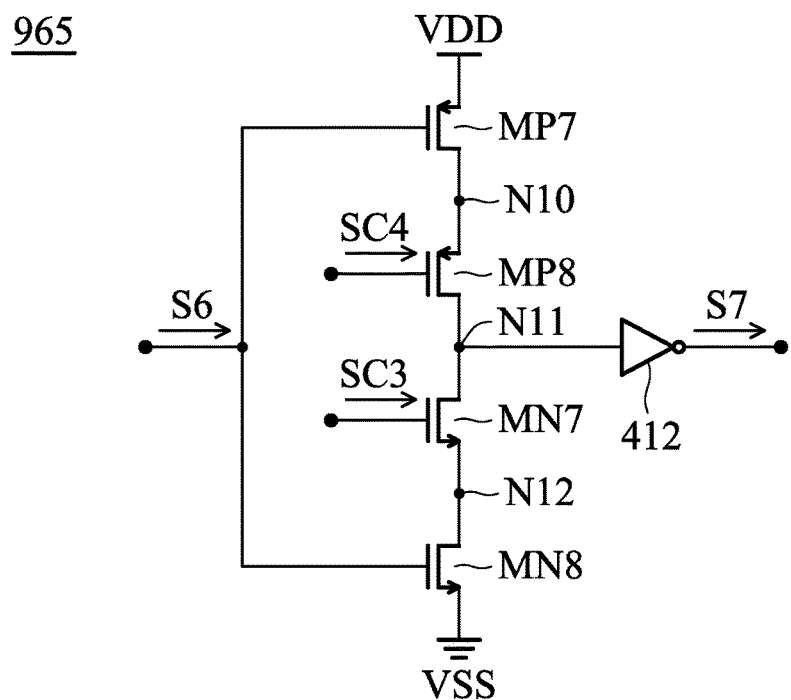
FIG. 10 is a diagram of a delay unit according to an embodiment of the invention.

FIG. 10 is a diagram of a delay unit according to an embodiment of the invention. In the embodiment of FIG. 10, the fifth delay unit 965 includes a seventh PMOS transistor (P-type Metal Oxide Semiconductor Field Effect Transistor) MP7, an eighth PMOS transistor MP8, a seventh NMOS transistor (N-type Metal Oxide Semiconductor Field Effect Transistor) MN7, an eighth NMOS transistor MN8, and a second inverter 412. The seventh PMOS transistor MP7 has a control terminal for receiving the sixth signal S6, a first terminal coupled to the supply voltage VDD, and a second terminal coupled to a tenth node N10. The eighth PMOS transistor MP8 has a control terminal for receiving the fourth control signal SC4, a first terminal coupled to the tenth node N10, and a second terminal coupled to an eleventh node N11. The seventh NMOS transistor MN7 has a control terminal for receiving the third control signal SC3, a first terminal coupled to a twelfth node N12, and a second terminal coupled to the eleventh node N11. The eighth NMOS transistor MN8 has a control terminal for receiving the sixth signal S6, a first terminal coupled to the ground voltage VSS, and a second terminal coupled to the twelfth node N12. The second inverter 412 has an input terminal coupled to the eleventh node N11, and an output terminal for outputting the seventh signal S7. Since the resistances of the eighth PMOS transistor MP8 and the seventh NMOS transistor MN7 are adjustable according to the third control signal SC3 and the fourth control signal SC4, the delay time τC of the fifth delay unit 965 is tunable and determined by the second control circuit 880. Similar with the embodiment of FIG. 4, in other embodiments, the delay unit may have other configurations, such as with the sixth signal S6 coupled to control terminals of transistors other than both the topmost and bottommost. In general, the control terminal of one of the two transistors coupled between the supply voltage VDD and the eleventh node N11 may be coupled to the sixth signal S6, while the control terminal of the other one of the two transistors coupled between the supply voltage VDD and the eleventh node N11 may be coupled to the fourth control signal SC4; in general, the control terminal of one of the two transistors coupled between the ground voltage VSS and the eleventh node N11 may be coupled to the sixth signal S6, while the control terminal of the other one of the two transistors coupled between the ground voltage VSS and the eleventh node N11 may be coupled to the third control signal SC3.

Figure 11A:
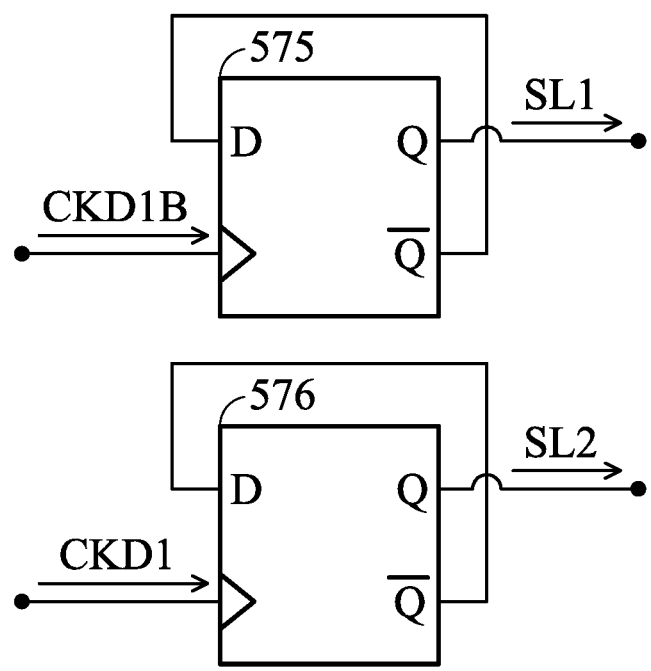
FIG. 11A is a diagram of a slow controller according to an embodiment of the invention.

In some embodiments, the second control circuit 880 includes a slow controller 881. FIG. 11A is a diagram of the slow controller 881 according to an embodiment of the invention. In the embodiment of FIG. 11A, the slow controller 881 includes a fifth D flop-flop 575 and a sixth D flop-flop 576. The fifth D flip-flop 575 has a data terminal (D), a clock terminal (Triangle Symbol) for receiving an inverted first delay clock signal CKD1B, an output terminal (Q) for outputting a first slow signal SL1, and an inverted output terminal (Q) fed back to the data terminal (D). The inverted first delay clock signal CKD1B has a complementary logic level to that of the first delay clock signal CKD1, and may be generated by using an inverter. The sixth D flip-flop 576 has a data terminal (D), a clock terminal (Triangle Symbol) for receiving the first delay clock signal CKD1, an output terminal (Q) for outputting a second slow signal SL2, and an inverted output terminal (Q) fed back to the data terminal (D). The slow controller 881 is configured to simulate the clock-to-output delay of the main D flip-flop 240, and the first slow signal SL1 and the second slow signal SL2 are used to compensate for the non-ideal characteristics of the main D flip-flop 240.

Figure 11B:
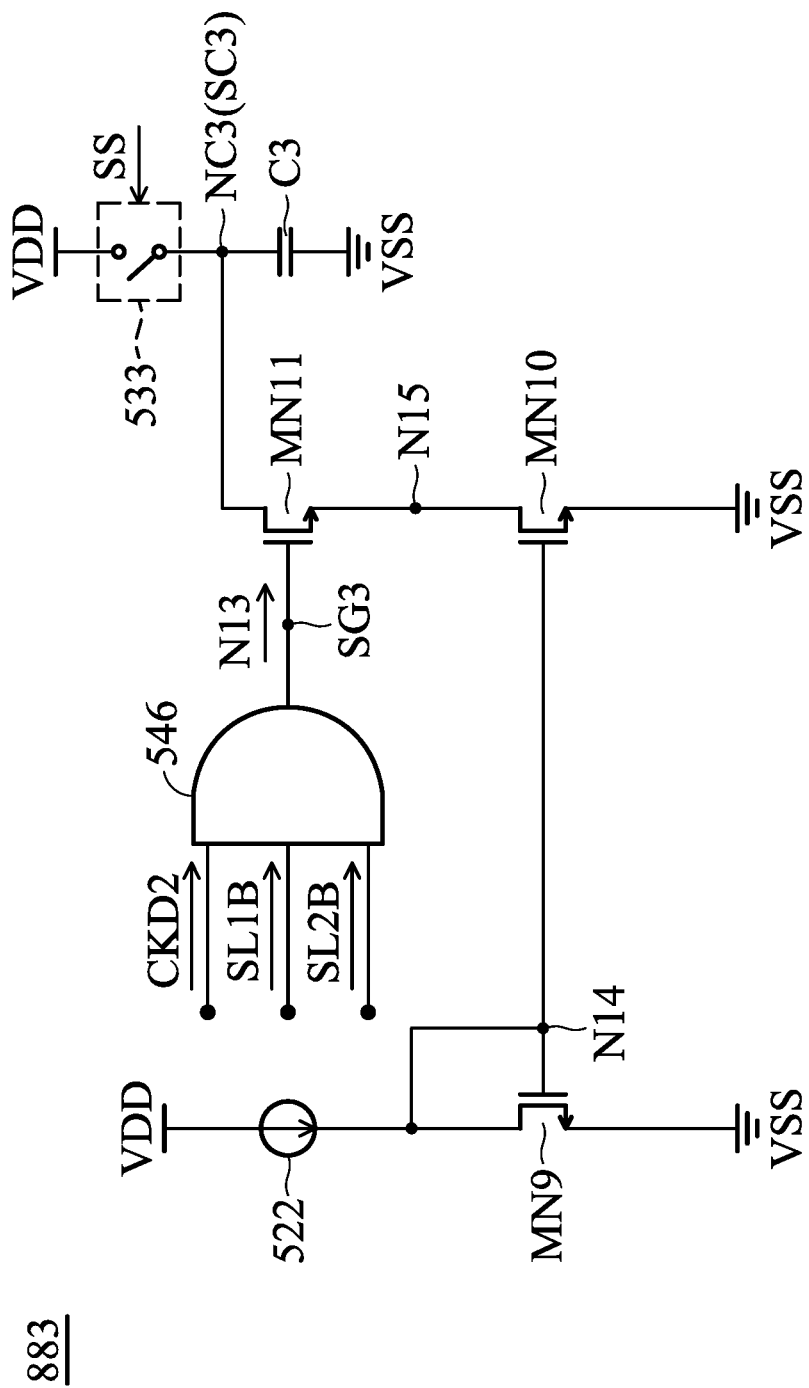
FIG. 11B is a diagram of a third tuner according to an embodiment of the invention.

In some embodiments, the second control circuit 880 includes a third tuner 883. FIG. 11B is a diagram of the third tuner 883 according to an embodiment of the invention. In the embodiment of FIG. 11B, the third tuner 883 includes a sixth AND gate 546, a ninth NMOS transistor (N-type Metal Oxide Semiconductor Field Effect Transistor) MN9, a tenth NMOS transistor MN10, an eleventh NMOS transistor MN11, a second current source 522, a third capacitor C3, and a third switch 533. The sixth AND gate 546 has a first input terminal for receiving the second delay clock signal CKD2, a second input terminal for receiving an inverted first slow signal SL1B, a third input terminal for receiving an inverted second slow signal SL2B, and an output terminal for outputting a third gate control signal SG3 at a thirteenth node N13. The inverted first slow signal SL1B has a complementary logic level to that of the first slow signal SL1, and may be generated by using an inverter. The inverted second slow signal SL2B has a complementary logic level to that of the second slow signal SL2, and may be generated by using an inverter. The ninth NMOS transistor MN9 has a control terminal coupled to a fourteenth node N14, a first terminal coupled to the ground voltage VSS, and a second terminal coupled to the fourteenth node N14. The second current source 522 supplies a third current to the fourteenth node N14. The tenth NMOS transistor MN10 has a control terminal coupled to the fourteenth node N14, a first terminal coupled to the ground voltage VSS, and a second terminal coupled to a fifteenth node N15, so as to form a current mirror with the ninth NMOS transistor MN9, and to mirror the third current supplied to the fourteenth node N14 to the fifteenth node N15. The eleventh NMOS transistor MN11 has a control terminal coupled to the thirteenth node N13, a first terminal coupled to the fifteenth node N15, and a second terminal coupled to a third control node NC3. The third control node NC3 is arranged for outputting the third control signal SC3. The third capacitor C3 is coupled between the third control node NC3 and the ground voltage VSS. The third switch 533 is coupled between the supply voltage VDD and the third control node NC3. The third switch 533 is selectively closed (conducting) or opened (not conducting) according to the switch control signal SS. For example, if the switch control signal SS has a high logic level, the third switch 533 will be closed, and if the switch control signal SS has a low logic level, the third switch 532 will be opened.

Figure 11C:
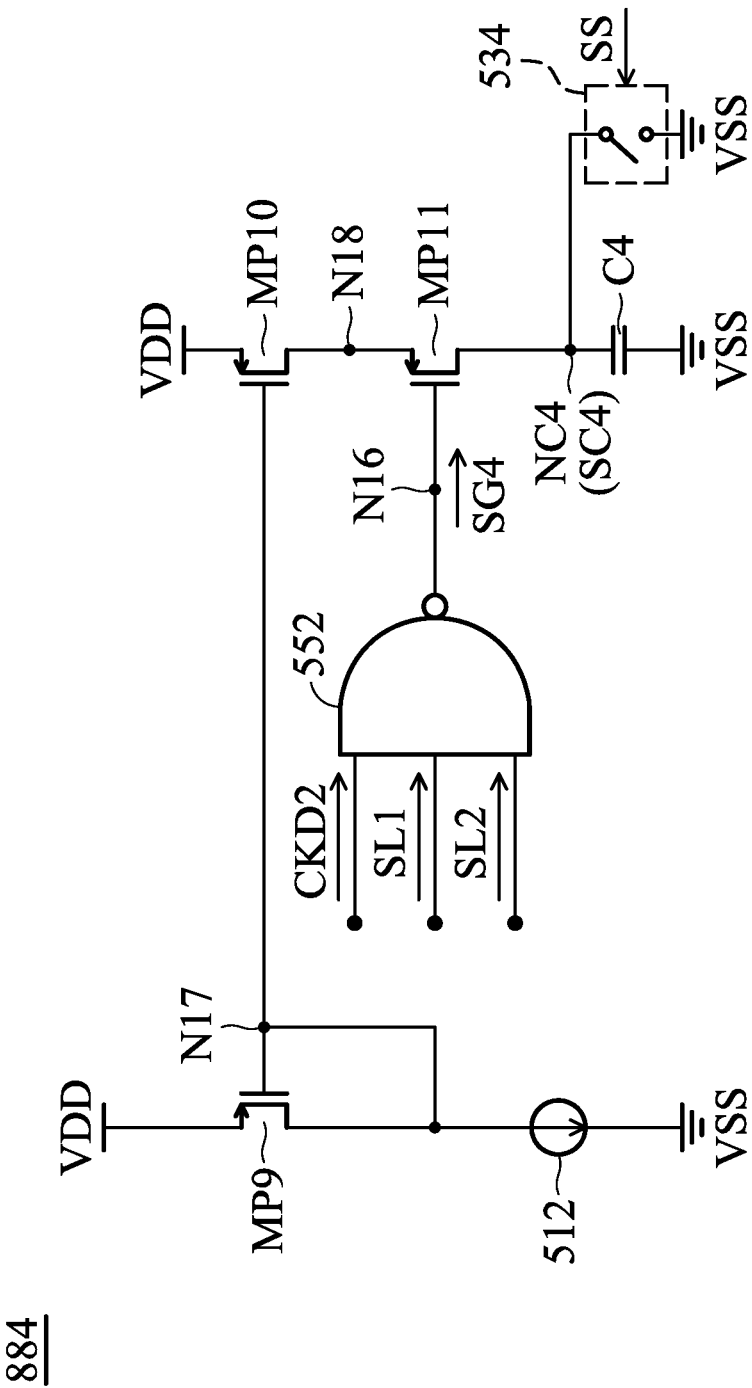
FIG. 11C is a diagram of a fourth tuner according to an embodiment of the invention.

In some embodiments, the second control circuit 880 includes a fourth tuner 884. FIG. 11C is a diagram of the fourth tuner 884 according to an embodiment of the invention. In the embodiment of FIG. 11C, the fourth tuner 884 includes a second NAND gate 552, a ninth PMOS transistor (P-type Metal Oxide Semiconductor Field Effect Transistor) MP9, a tenth PMOS transistor MP10, an eleventh PMOS transistor MP11, a second current sink 512, a fourth capacitor C4, and a fourth switch 534. The second NAND gate 552 has a first input terminal for receiving the second delay clock signal CKD2, a second input terminal for receiving the first slow signal SL1, a third input terminal for receiving the second slow signal SL2, and an output terminal for outputting a fourth gate control signal SG4 at a sixteenth node N16. The ninth PMOS transistor MP9 has a control terminal coupled to a seventeenth node N17, a first terminal coupled to the supply voltage VDD, and a second terminal coupled to the seventeenth node N17. The second current sink 512 draws a fourth current from the seventeenth node N17. The tenth PMOS transistor MP10 has a control terminal coupled to the seventeenth node N17, a first terminal coupled to the supply voltage VDD, and a second terminal coupled to an eighteenth node N18, so as to form a current mirror with the ninth PMOS transistor MP9, and to mirror the fourth current drawn from the seventeenth node N17 to the eighteenth node N18. The eleventh PMOS transistor MP11 has a control terminal coupled to the sixteenth node N16, a first terminal coupled to the eighteenth node N18, and a second terminal coupled to a fourth control node NC4. The fourth control node NC4 is arranged for outputting the fourth control signal SC4. The fourth capacitor C4 is coupled between the fourth control node NC4 and the ground voltage VSS. The fourth switch 534 is coupled between the fourth control node NC4 and the ground voltage VSS. The fourth switch 534 is selectively closed (conducting) or opened (not conducting) according to the switch control signal SS. For example, if the switch control signal SS has a high logic level, the fourth switch 534 will be closed, and if the switch control signal SS has a low logic level, the fourth switch 534 will be opened.

Initially, the third switch 533 and the fourth switch 534 are both temporarily closed, such that the voltage level of the third control signal SC3 is initialized to be the supply voltage VDD, and the voltage level of the fourth control signal SC4 is initialized to be the ground voltage VSS. At this time, the delay time τC of the fifth delay unit 965 of the delay compensation circuit 960 is initially minimized because the eighth PMOS transistor MP8 and the seventh NMOS transistor MN7 have the lowest resistance. Next, during the tuning process, the third switch 533 and the fourth switch 534 are both opened and kept open, and the third tuner 883 and the fourth tuner 884 of the second control circuit 880 start to fine-tune the voltage levels of the third control signal SC3 and the fourth control signal SC4, which adjust the resistances of the seventh NMOS transistor MN7 and the eighth PMOS transistor MP8, so as to control the total delay time of the delay compensation circuit 960. Ideally, the final total delay time of the delay compensation circuit 960, for both the clock tuning circuit 860 and the data tuning circuit 870, should be exactly equal to the clock-to-output delay of the main D flip-flop 240 (i.e. TCQ).

Figure 12A:
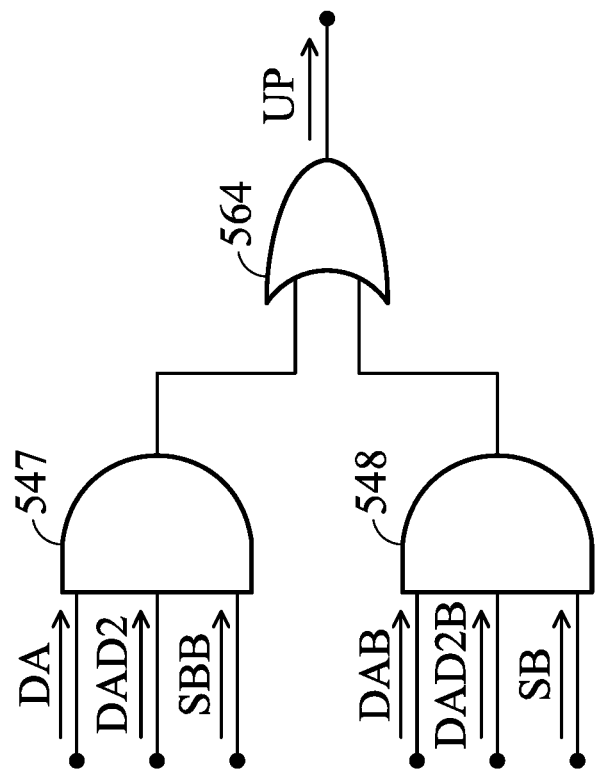
FIG. 12A is a diagram of an up control combination circuit according to an embodiment of the invention.

In some embodiments, the logic circuit 850 includes an up control combination circuit 910. FIG. 12A is a diagram of the up control combination circuit 910 according to an embodiment of the invention. In the embodiment of FIG. 12A, the up control combination circuit 910 includes a seventh AND gate 547, an eighth AND gate 548, and a fourth OR gate 564. The seventh AND gate 547 has a first input terminal for receiving the data signal DA, a second input terminal for receiving the second delay data signal DAD2, a third input terminal for receiving the inverted register signal SBB, and an output terminal. The eighth AND gate 548 has a first input terminal for receiving the inverted data signal DAB, a second input terminal for receiving an inverted second delay data signal DAD2B, a third input terminal for receiving the register signal SB, and an output terminal. The inverted second delay data signal DAD2B has a complementary logic level to that of the second delay data signal DAD2, and may be generated by using an inverter. The fourth OR gate 564 has a first input terminal coupled to the output terminal of the seventh AND gate 547, a second input terminal coupled to the output terminal of the eighth AND gate 548, and an output terminal for outputting the up control signal UP.

Figure 12B:
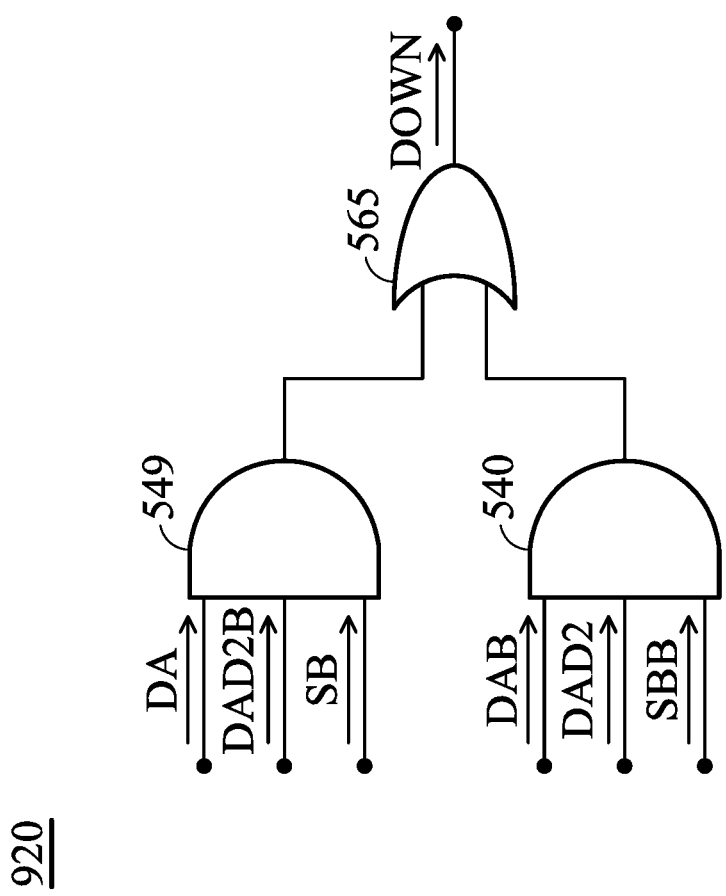
FIG. 12B is a diagram of a down control combination circuit according to an embodiment of the invention.

In some embodiments, the logic circuit 850 includes a down control combination circuit 920. FIG. 12B is a diagram of the down control combination circuit 920 according to an embodiment of the invention. In the embodiment of FIG. 12B, the down control combination circuit 920 includes a ninth AND gate 549, a tenth AND gate 540, and a fifth OR gate 565. The ninth AND gate 549 has a first input terminal for receiving the data signal DA, a second input terminal for receiving the inverted second delay data signal DAD2B, a third input terminal for receiving the register signal SB, and an output terminal. The tenth AND gate 540 has a first input terminal for receiving the inverted data signal DAB, a second input terminal for receiving the second delay data signal DAD2, a third input terminal for receiving the inverted register signal SBB, and an output terminal. The fifth OR gate 565 has a first input terminal coupled to the output terminal of the ninth AND gate 549, a second input terminal coupled to the output terminal of the tenth AND gate 540, and an output terminal for outputting the down control signal DOWN.

To be brief, in the embodiment of FIG. 12A and FIG. 12B, the up control signal UP and the down control signal DOWN are represented as the following logic equations (3) and (4).

$$UP = DA \cdot DAD2 \cdot \overline{SB} + \overline{DA} \cdot \overline{DAD2} \cdot SB \tag{3}$$

$$DOWN = DA \cdot \overline{DAD2} \cdot SB + \overline{DA} \cdot DAD2 \cdot \overline{SB} \tag{4}$$

where "UP" represents the logic level of the up control signal UP, "DOWN" represents the logic level of the down control signal DOWN, "DA" represents the logic level of the data signal DA, "DAD2" represents the logic level of the second delay data signal DAD2, "SB" represents the logic level of the register signal SB, "$\overline{DA}$" represents the logic level of the inverted data signal DAB, "$\overline{DAD2}$" represents the logic level of the inverted second delay data signal DAD2B, and "$\overline{SB}$" represents the logic level of the inverted register signal SBB.

Figure 13A:
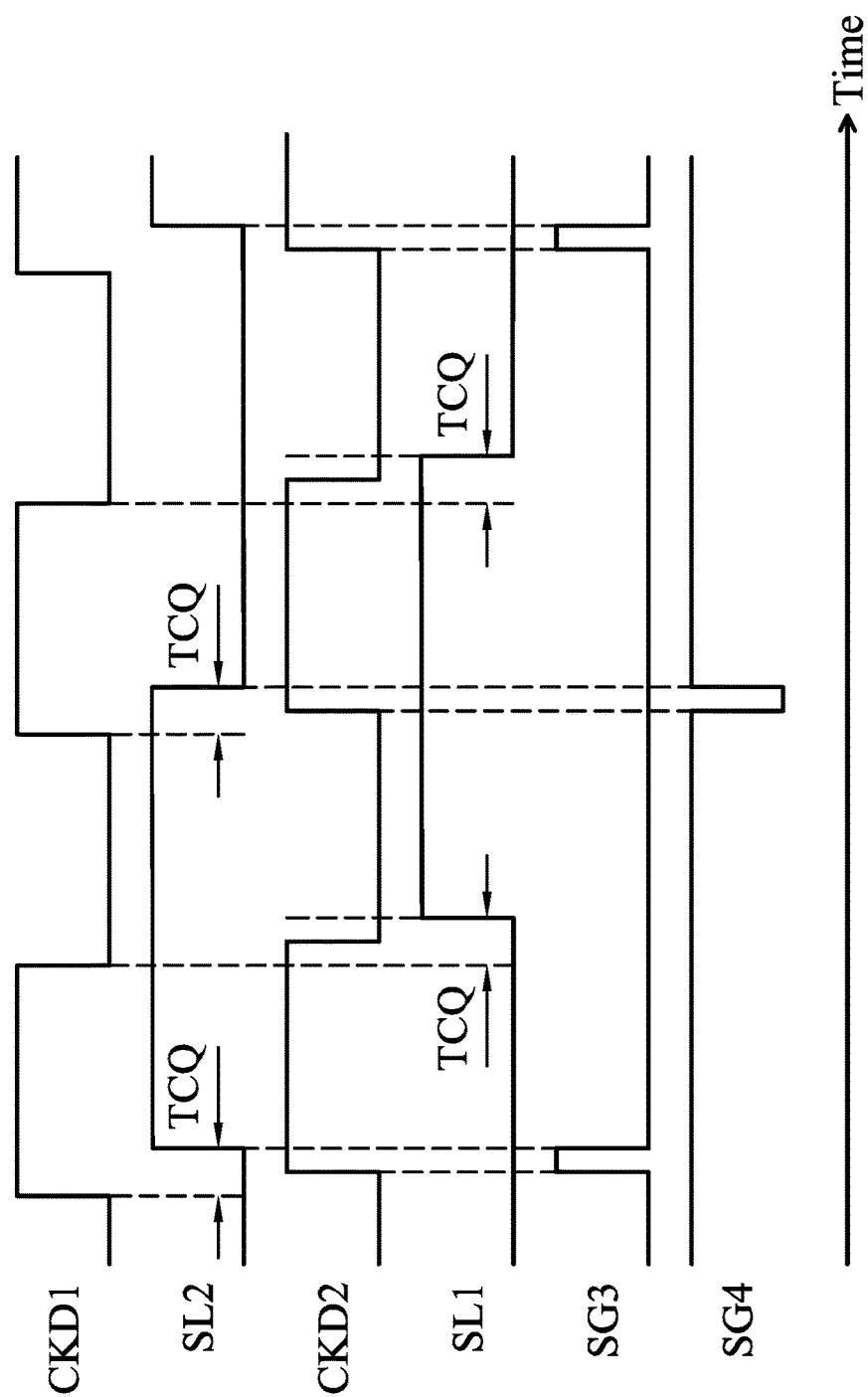
FIG. 13A is a diagram of signal waveforms of a slow controller, a third tuner, and a fourth tuner according to an embodiment of the invention.

FIG. 13A is a diagram of signal waveforms of the slow controller 881, the third tuner 883, and the fourth tuner 884 according to an embodiment of the invention. Please refer to FIG. 11A, FIG. 11B, FIG. 11C, and FIG. 13A together. The third gate control signal SG3 and the fourth gate control signal SG4 are arranged for fine-tuning the voltage levels of the third control signal SC3 and the fourth control signal SC4, respectively. In the beginning, the delay time of the delay compensation circuit 960 is minimized, and it results in the widest pulses of the third gate control signal SG3 (i.e., the high voltage pulses) and the fourth gate control signal SG4 (i.e., the low voltage pulses). Then, during the tuning process, the rising edges of the second delay clock signal CKD2 gradually aligns with those of the second slow signal SL2, and the pulses of the third gate control signal SG3 and the fourth gate control signal SG4 become narrower and narrower over the time axis. Finally, when the pulses of the third gate control signal SG3 and the fourth gate control signal SG4 completely disappear (i.e., when the second delay clock signal CKD2 is synchronized with the second slow signal SL2), each of the third control signal SC3 and the fourth control signal SC4 reaches a respective constant value, and the total delay time of the delay compensation circuit 960, for both the clock tuning circuit 860 and the data tuning circuit 870, should become exactly equal to the clock-to-output delay of the main D flip-flop 230 (i.e., TCQ). At this time, the second delay clock signal CKD2 lags the first delay clock signal CKD1 by the clock-to-output delay (i.e., TCQ), and the second delay data signal DAD2 also lags the first delay data signal DAD1 by the clock-to-output delay (i.e., TCQ).

Figure 13B:
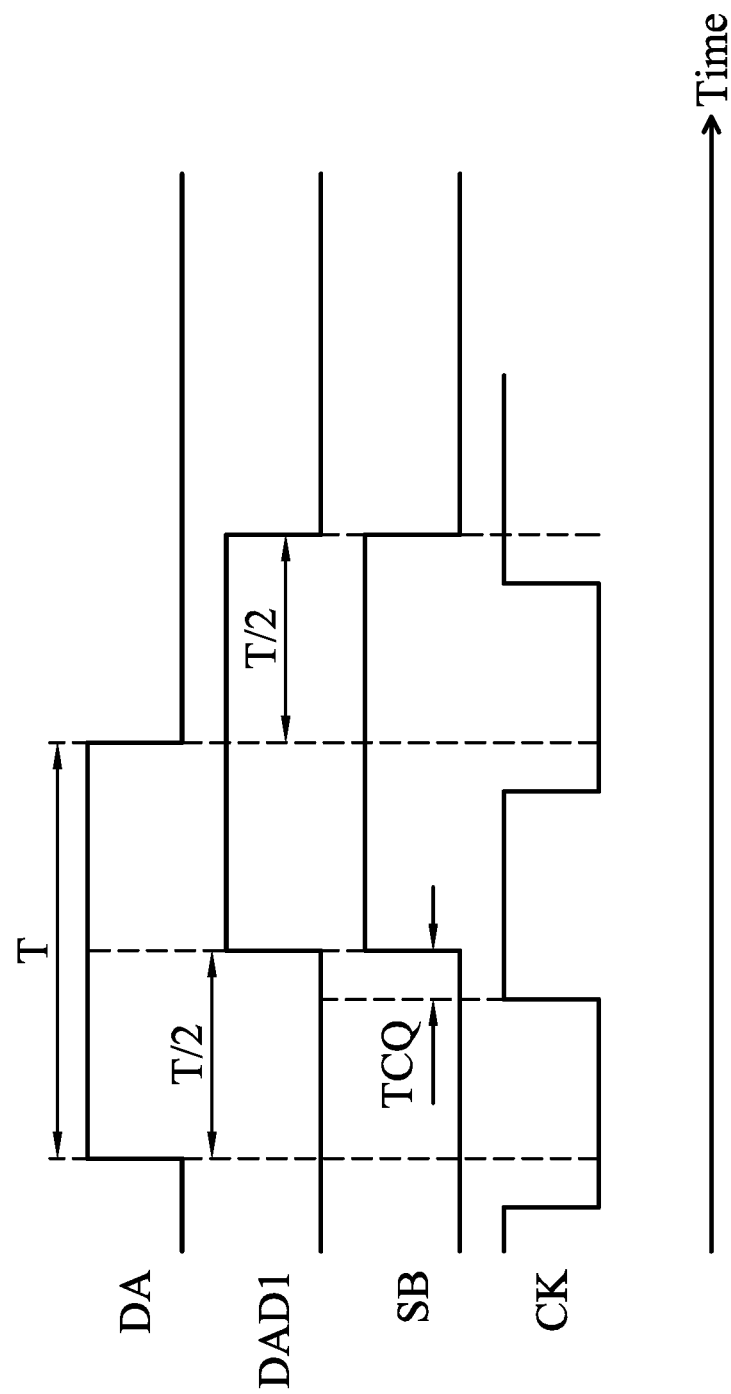
FIG. 13B is a diagram of signal waveforms of a phase detector when a clock-to-output delay occurs in a main D flip-flop.

FIG. 13B is a diagram of signal waveforms of the phase detector 200 when the clock-to-output delay TCQ occurs in the main D flip-flop 240. Under non-ideal circumstances, when the tuning process has been completed, the first delay data signal DAD1 (and the register signal SB) lags the data signal DA by half of the bit-time (i.e., T/2); however, the rising edge of the clock signal CK leads the central point of the pulse of the data signal DA by the clock-to-output delay TCQ, which is due to the non-ideal delay between the clock terminal (Triangle Symbol) and the output terminal (Q) of the main D flip-flop 240. The phase error caused by the clock-to-output delay TCQ tends to slightly reduce the accuracy of the recovered clock.

Figure 13C:
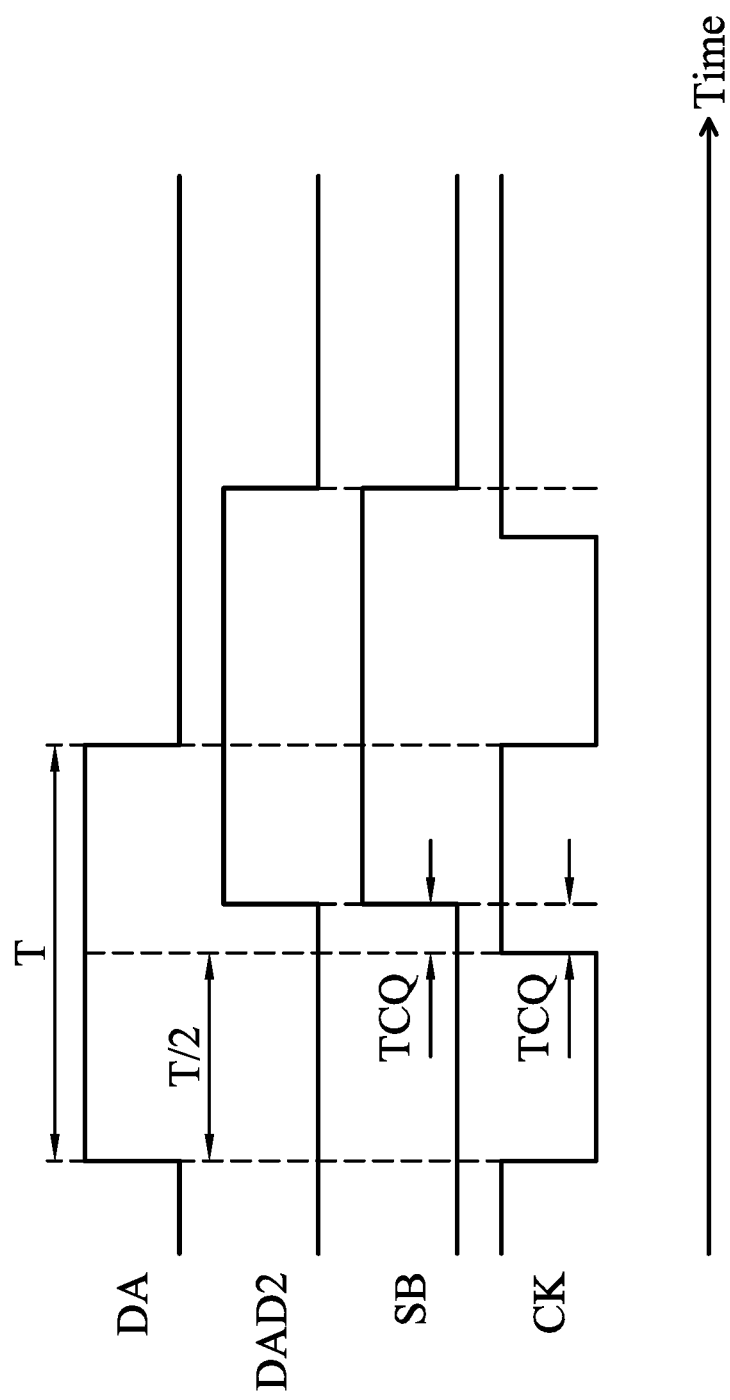
FIG. 13C is a diagram of signal waveforms of a phase detector according to an embodiment of the invention.

FIG. 13C is a diagram of signal waveforms of the phase detector 800 according to an embodiment of the invention. For the phase detector 800, the data tuning circuit 870 further delays the first delay data signal DAD1 for an appropriate delay time (i.e., the clock-to-output delay TCQ) so as to generate the second delay data signal DAD2. Instead of the first delay data signal DAD1, the second delay data signal DAD2 is applied to one input terminal of the logic circuit 850 of the phase detector 800. With such a design, because the timing of the second delay data signal DAD2 is fine-tuned to compensate for the clock-to-output delay TCQ of the main D flip-flop 240, the rising edge of the clock signal CK can be aligned exactly with the central point of the pulse of the data signal DA, and this prevents the clock-to-output delay TCQ from negatively affecting the accuracy of the recovered clock. It should be noted that the clock tuning circuit 860, the data tuning circuit 870, and the second control circuit 880 are optional elements for suppressing the non-ideal clock-to-output delay of the main D flip-flop 240. In alternative embodiments, these optional elements may be removed from the phase detector 800 (as the phase detector 200).

The invention provides a novel phase detector for use in a CDR (Clock Data Recovery) circuit. In conclusion, the proposed design has at least the following advantages over the prior art: (1) stabilizing the output control voltage of the charge pump of the CDR circuit, (2) suppressing the jitter in the recovered clock of the CDR circuit, and (3) optionally compensating for the non-ideal characteristics of the main D flip-flop of the CDR circuit.

Note that the above voltages, currents, resistances, inductances, capacitances and other element parameters are not limitations of the invention. A designer can adjust these parameters according to different requirements. The phase detector and CDR circuit of the invention are not limited to the configurations of FIGS. 1-13. The invention may merely include any one or more features of any one or more embodiments of FIGS. 1-13. In other words, not all of the features displayed in the figures should be implemented in the phase detector and CDR circuit of the invention. Although the embodiments of the invention use MOSFETs as examples, the invention is not limited thereto, and those skilled in the art may use other types of transistors such as BJT (Bipolar Junction Transistors), JFET (Junction Gate Field Effect Transistor), FinFET (Fin Field Effect Transistor), etc.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be apparent to those skilled in the art that various modifications and variations can be made in the invention. It is intended that the standard and examples be considered exemplary only, with a true scope of the disclosed embodiments being indicated by the following claims and their equivalents.

What is claimed is:

1. A phase detector for use in a CDR (Clock Data Recovery) circuit, wherein the CDR circuit generates a clock signal according to a data signal, comprising:
   a clock delay circuit, delaying the clock signal so as to generate a first delay clock signal, wherein a delay time of the clock delay circuit is adjustable according to a first control signal and a second control signal;
   a data delay circuit, delaying the data signal so as to generate a first delay data signal, wherein a delay time of the data delay circuit is adjustable according to the first control signal and the second control signal;
   a first control circuit, generating the first control signal and the second control signal according to the clock signal and the first delay clock signal;
   a main D flip-flop, generating a register signal according to the data signal and the clock signal; and
   a logic circuit, generating an up control signal and a down control signal according to the data signal, the first delay data signal, and the register signal so as to control a charge pump of the CDR circuit.

2. The phase detector as claimed in claim 1, wherein the main D flip-flop has a data terminal for receiving the data signal, a clock terminal for receiving the clock signal, and an output terminal for outputting the register signal.

3. The phase detector as claimed in claim 1, wherein each of the clock delay circuit and the data delay circuit comprises an HBTD (Half Bit-Time Delay) circuit, wherein the HBTD circuit comprises a plurality of delay units, wherein the plurality of delay units are cascaded between a HBTD input and a HBTD output to generate delay, wherein a delay time of each of the plurality of delay units is adjustable according to the first control signal and the second control signal, wherein for the HBTD circuit of the clock delay circuit, the HBTD input receives the clock signal and the HBTD output generates the first delay clock signal, and wherein for the HBTD circuit of the data delay circuit, the HBTD input receives the data signal and the HBTD output generates the first delay data signal.

4. The phase detector as claimed in claim 3, wherein each of the plurality of delay units comprises:

a first P-type transistor, wherein the first P-type transistor has a control terminal, a first terminal coupled to a supply voltage, and a second terminal coupled to a first node;

a second P-type transistor, wherein the second P-type transistor has a control terminal, a first terminal coupled to the first node, and a second terminal coupled to a second node;

a first N-type transistor, wherein the first N-type transistor has a control terminal, a first terminal coupled to a third node, and a second terminal coupled to the second node;

a second N-type transistor, wherein the second N-type transistor has a control terminal, a first terminal coupled to a ground voltage, and a second terminal coupled to the third node; and a first inverter, wherein the first inverter has an input terminal coupled to the second node, and an output terminal coupled to a delay unit output node, wherein the control terminal of one of the first P-type transistor and the second P-type transistor is coupled to a delay unit input node, and the control terminal of the other one of the first P-type transistor and the second P-type transistor is coupled to the first control signal, wherein the control terminal of one of the first N-type transistor and the second N-type transistor is coupled to the delay unit input node, and the control terminal of the other one of the first N-type transistor and the second N-type transistor is coupled to the second control signal.

5. The phase detector as claimed in claim 1, wherein the first control circuit comprises a first tuner which comprises:

a first OR gate, wherein the first OR gate has a first input terminal for receiving the clock signal, a second input terminal for receiving the first delay clock signal, and an output terminal for outputting a first gate control signal at a fourth node;

a third P-type transistor, wherein the third P-type transistor has a control terminal coupled to a fifth node, a first terminal coupled to a supply voltage, and a second terminal coupled to the fifth node;

a first current sink, drawing a first current from the fifth node;

a fourth P-type transistor, wherein the fourth P-type transistor has a control terminal coupled to the fifth node, a first terminal coupled to the supply voltage, and a second terminal coupled to a sixth node;

a fifth P-type transistor, wherein the fifth P-type transistor has a control terminal coupled to the fourth node, a first terminal coupled to the sixth node, and a second terminal coupled to a first control node;

a first capacitor, coupled between the first control node and a ground voltage, wherein the first control node is arranged for outputting the first control signal; and a first switch, coupled between the first control node and the ground voltage, wherein the first switch is selectively closed or opened according to a switch control signal.

6. The phase detector as claimed in claim 1, wherein the first control circuit comprises a second tuner which comprises:

a first AND gate, wherein the first AND gate has a first input terminal for receiving the clock signal, a second input terminal for receiving the first delay clock signal, and an output terminal for outputting a second gate control signal at a seventh node;

a third N-type transistor, wherein the third N-type transistor has a control terminal coupled to an eighth node, a first terminal coupled to the ground voltage, and a second terminal coupled to the eighth node;

a first current source, supplying a second current to the eighth node;

a fourth N-type transistor, wherein the fourth N-type transistor has a control terminal coupled to the eighth node, a first terminal coupled to the ground voltage, and a second terminal coupled to a ninth node;

a fifth N-type transistor, wherein the fifth N-type transistor has a control terminal coupled to the seventh node, a first terminal coupled to the ninth node, and a second terminal coupled to a second control node;

a second capacitor, coupled between the second control node and the ground voltage, wherein the second control node is arranged for outputting the second control signal; and a second switch, coupled between the supply voltage and the second control node, wherein the second switch is selectively closed or opened according to the switch control signal.

7. The phase detector as claimed in claim 5, wherein the first control circuit further comprises a power-saving circuit which comprises:

a sixth P-type transistor, wherein the sixth P-type transistor has a control terminal for receiving a second power-saving signal, a first terminal coupled to the supply voltage, and a second terminal coupled to the fifth node, wherein the second power-saving signal is outputted to be at low voltage level after a predetermined time to turn off both the third P-type transistor and the fourth P-type transistor.

8. The phase detector as claimed in claim 6, wherein the first control circuit further comprises a power-saving circuit which comprises:

a sixth N-type transistor, wherein the sixth N-type transistor has a control terminal for receiving a first power-saving signal, a first terminal coupled to the ground voltage, and a second terminal coupled to the eighth node, wherein the first power-saving signal is outputted to be at high voltage level after a predetermined time to turn off both the third N-type transistor and the fourth N-type transistor.

9. The phase detector as claimed in claim 1, wherein the logic circuit comprises an up control combination circuit which comprises:

a second AND gate, wherein the second AND gate has a first input terminal for receiving the data signal, a second input terminal for receiving the first delay data signal, a third input terminal for receiving an inverted register signal, and an output terminal, wherein the inverted register signal has a complementary logic level to that of the register signal;

a third AND gate, wherein the third AND gate has a first input terminal for receiving an inverted data signal, a second input terminal for receiving an inverted first delay data signal, a third input terminal for receiving the register signal, and an output terminal, wherein the inverted data signal has a complementary logic level to that of the data signal, and wherein the inverted first delay data signal has a complementary logic level to that of the first delay data signal; and a second OR gate, wherein the second OR gate has a first input terminal coupled to the output terminal of the second AND gate, a second input terminal coupled to the output terminal of the third AND gate, and an output terminal for outputting the up control signal.

10. The phase detector as claimed in claim 1, wherein the logic circuit comprises a down control combination circuit which comprises:
   a fourth AND gate, wherein the fourth AND gate has a first input terminal for receiving the data signal, a second input terminal for receiving the inverted first delay data signal, a third input terminal for receiving the register signal, and an output terminal, wherein the inverted first delay data signal has a complementary logic level to that of the first delay data signal;
   a fifth AND gate, wherein the fifth AND gate has a first input terminal for receiving the inverted data signal, a second input terminal for receiving the first delay data signal, a third input terminal for receiving the inverted register signal, and an output terminal, wherein the inverted data signal has a complementary logic level to that of the data signal, and wherein the inverted register signal has a complementary logic level to that of the register signal; and
   a third OR gate, wherein the third OR gate has a first input terminal coupled to the output terminal of the fourth AND gate, a second input terminal coupled to the output terminal of the fifth AND gate, and an output terminal for outputting the down control signal.

11. The phase detector as claimed in claim 1, further comprising:
   a clock tuning circuit, delaying the first delay clock signal so as to generate a second delay clock signal, wherein a delay time of the clock tuning circuit is adjustable according to a third control signal and a fourth control signal;
   a data tuning circuit, delaying the first delay data signal so as to generate a second delay data signal, wherein a delay time of the data tuning circuit is adjustable according to the third control signal and the fourth control signal; and
   a second control circuit, generating the third control signal and the fourth control signal according to the first delay clock signal and the second delay clock signal;
   wherein the logic circuit generates the up control signal and the down control signal further according to the second delay data signal.

12. The phase detector as claimed in claim 11, wherein each of the clock tuning circuit and the data tuning circuit comprises a delay compensation circuit, wherein the delay compensation circuit comprises:
   a compensation delay unit, delaying a compensation input signal so as to generate a compensation output signal;
   wherein a delay time of the compensation delay unit is adjustable according to the third control signal and the fourth control signal,
   wherein for the delay compensation circuit of the clock tuning circuit, the compensation input signal is the first delay clock signal and the compensation output signal is the second delay clock signal, and wherein for the delay compensation circuit of the data tuning circuit, the compensation input signal is the first delay data signal and the compensation output signal is the second delay data signal.

13. The phase detector as claimed in claim 12, wherein the compensation delay unit comprises:
   a seventh P-type transistor, wherein the seventh P-type transistor has a control terminal, a first terminal coupled to a supply voltage, and a second terminal coupled to a tenth node;
   an eighth P-type transistor, wherein the eighth P-type transistor has a control terminal, a first terminal coupled to the tenth node, and a second terminal coupled to an eleventh node;
   a seventh N-type transistor, wherein the seventh N-type transistor has a control terminal, a first terminal coupled to a twelfth node, and a second terminal coupled to the eleventh node;
   an eighth N-type transistor, wherein the eighth N-type transistor has a control terminal, a first terminal coupled to a ground voltage, and a second terminal coupled to the twelfth node; and
   a second inverter, wherein the second inverter has an input terminal coupled to the eleventh node, and an output terminal for outputting the compensation output signal,
   wherein the control terminal of one of the seventh P-type transistor and the eighth P-type transistor is coupled to the compensation input signal, and the control terminal of the other one of the seventh P-type transistor and the eighth P-type transistor is coupled to the fourth control signal,
   wherein the control terminal of one of the seventh N-type transistor and the eighth N-type transistor is coupled to the compensation input signal, and the control terminal of the other one of the seventh N-type transistor and the eighth N-type transistor is coupled to the third control signal.

14. The phase detector as claimed in claim 11, wherein the second control circuit comprises a slow controller which comprises:
   a fifth D flip-flop, wherein the fifth D flip-flop has a data terminal, a clock terminal for receiving an inverted first delay clock signal, an output terminal for outputting a first slow signal, and an inverted output terminal fed back to the data terminal, wherein the inverted first delay clock signal has a complementary logic level to that of the first delay clock signal; and
   a sixth D flip-flop, wherein the sixth D flip-flop has a data terminal, a clock terminal for receiving the first delay clock signal, an output terminal for outputting a second slow signal, and an inverted output terminal fed back to the data terminal.

15. The phase detector as claimed in claim 14, wherein the second control circuit further comprises a third tuner which comprises:
   a sixth AND gate, wherein the sixth AND gate has a first input terminal for receiving the second delay clock signal, a second input terminal for receiving an inverted first slow signal, a third input terminal for receiving an inverted second slow signal, and an output terminal for outputting a third gate control signal, wherein the inverted first slow signal has a complementary logic level to that of the first slow signal, wherein the inverted second slow signal has a complementary logic level to that of the second slow signal;
   an eleventh N-type transistor, wherein the eleventh N-type transistor has a control terminal coupled to the third gate control signal, a first terminal, and a second terminal coupled to a third control node, wherein a third current is drawn from the first terminal of the eleventh N-type transistor;

a third capacitor, coupled between the third control node and the ground voltage, wherein the third control node is arranged for outputting the third control signal; and a third switch, coupled between a supply voltage and the third control node, wherein the third switch is selectively closed or opened according to a switch control signal.

16. The phase detector as claimed in claim 14, wherein the second control circuit further comprises a fourth tuner which comprises:

a second NAND gate, wherein the second NAND gate has a first input terminal for receiving the second delay clock signal, a second input terminal for receiving the first slow signal, a third input terminal for receiving the second slow signal, and an output terminal for outputting a fourth gate control signal at a sixteenth node;

an eleventh P-type transistor, wherein the eleventh P-type transistor has a control terminal coupled to the fourth gate control signal, a first terminal, and a second terminal coupled to a fourth control node, wherein a fourth current is supplied to the first terminal of the eleventh P-type transistor;

a fourth capacitor, coupled between the fourth control node and the ground voltage, wherein the fourth control node is arranged for outputting the fourth control signal; and a fourth switch, coupled between the fourth control node and the ground voltage, wherein the fourth switch is selectively closed or opened according to the switch control signal.

17. The phase detector as claimed in claim 11, wherein the logic circuit comprises an up control combination circuit which comprises:

a seventh AND gate, wherein the seventh AND gate has a first input terminal for receiving the data signal, a second input terminal for receiving the second delay data signal, a third input terminal for receiving an inverted register signal, and an output terminal, wherein the inverted register signal has a complementary logic level to that of the register signal;

an eighth AND gate, wherein the eighth AND gate has a first input terminal for receiving an inverted data signal, a second input terminal for receiving an inverted second delay data signal, a third input terminal for receiving the register signal, and an output terminal, wherein the inverted data signal has a complementary logic level to that of the data signal, and wherein the inverted second delay data signal has a complementary logic level to that of the second delay data signal; and a fourth OR gate, wherein the fourth OR gate has a first input terminal coupled to the output terminal of the seventh AND gate, a second input terminal coupled to the output terminal of the eighth AND gate, and an output terminal for outputting the up control signal.

18. The phase detector as claimed in claim 11, wherein the logic circuit comprises a down control combination circuit which comprises:

a ninth AND gate, wherein the ninth AND gate has a first input terminal for receiving the data signal, a second input terminal for receiving the inverted second delay data signal, a third input terminal for receiving the register signal, and an output terminal, wherein the inverted second delay data signal has a complementary logic level to that of the second delay data signal;

a tenth AND gate, wherein the tenth AND gate has a first input terminal for receiving the inverted data signal, a second input terminal for receiving the second delay data signal, a third input terminal for receiving the inverted register signal, and an output terminal, wherein the inverted data signal has a complementary logic level to that of the data signal, and wherein the inverted register signal has a complementary logic level to that of the register signal; and a fifth OR gate, wherein the fifth OR gate has a first input terminal coupled to the output terminal of the ninth AND gate, a second input terminal coupled to the output terminal of the tenth AND gate, and an output terminal for outputting the down control signal.

* * * * *